US006600169B2

(12) United States Patent
Stintz et al.

(10) Patent No.: US 6,600,169 B2
(45) Date of Patent: Jul. 29, 2003

(54) QUANTUM DASH DEVICE

(76) Inventors: Andreas Stintz, 4704 Hannett Ave. NE., Albuquerque, NM (US) 87110; Petros M Varangis, 7817 Pinewood Dr. NW., Albuquerque, NM (US) 87120; Kevin J Malloy, 7224 General Kearny Ct. NE., Albuquerque, NM (US) 87109-6304; Luke F Lester, 8409 Manual Cia Pl. NE., Albuquerque, NM (US) 87122; Timothy C Newell, 623 Valencia NE., Albuquerque, NM (US) 87108; Hua Li, 3399 Burgundy Dr., San Jose, CA (US) 95132

( * ) Notice: Subject to any disclaimer, the term of this patent is extended or adjusted under 35 U.S.C. 154(b) by 0 days.

(21) Appl. No.: 09/961,560

(22) Filed: Sep. 20, 2001

(65) Prior Publication Data

US 2002/0079485 A1 Jun. 27, 2002

Related U.S. Application Data

(60) Provisional application No. 60/234,344, filed on Sep. 22, 2000, provisional application No. 60/238,030, filed on Oct. 6, 2000, provisional application No. 60/252,084, filed on Apr. 21, 2000, provisional application No. 60/276,186, filed on Mar. 16, 2000, and provisional application No. 60/272,307, filed on Mar. 2, 2001.

(51) Int. Cl.[7] .................................................. H01L 29/06
(52) U.S. Cl. ................................ 257/14; 257/17; 257/15
(58) Field of Search ........................ 257/14, 17; 372/45, 372/46, 96; 437/129; 438/35

(56) References Cited

U.S. PATENT DOCUMENTS

| 5,541,949 A | * | 7/1996 | Bhat et al. ..................... 372/45 |
| 5,543,354 A | * | 8/1996 | Richard et al. ............. 437/129 |
| 5,557,627 A | * | 9/1996 | Schneider, Jr. et al. ....... 372/46 |
| 5,614,435 A | | 3/1997 | Petroff et al. ............... 437/110 |
| 5,710,436 A | * | 1/1998 | Tanamoto et al. ............. 257/14 |
| 5,714,765 A | * | 2/1998 | Noetzel et al. ................ 257/17 |
| 5,817,538 A | | 10/1998 | Mukai et al. .................. 438/41 |
| 5,881,086 A | * | 3/1999 | Miyazawa ..................... 372/46 |
| 5,953,356 A | * | 9/1999 | Botez et al. ................... 372/45 |
| 6,052,400 A | | 4/2000 | Nanbu et al. .................. 372/50 |
| 6,117,699 A | * | 9/2000 | Lemoff et al. ................ 438/35 |
| 6,177,684 B1 | * | 1/2001 | Sugiyama ..................... 257/17 |
| 6,285,704 B1 | * | 9/2001 | Kullander-Sjoberg et al. ... 372/96 |
| 6,329,668 B1 | * | 12/2001 | Razeghi ....................... 257/14 |
| 2001/0050934 A1 | * | 12/2001 | Choquette et al. ............ 372/43 |

OTHER PUBLICATIONS

US patent Application Publication US 2001/0050934 Dec. 13, 2001; Choquette et al. US class 372/43.*

Asryan, L.V; and Suris, R.A.; Charge Neutrality Violation In Quantum—Dot Lasers; IEEE Journal Of Selected Topics In Quantum Electronics; vol. 3, No. 2; Apr. 1997; pp. 148–157.

Bimberg, D.; Kirstaedter; N.; Ledenstov, N.N.; Alferov, Zh.I.; Kop'ev, P.S.; and Ustinov; V.M.; InGaAs–GaAs Quantum Dot Lasers; IEEE Journal Of Selected Topics In Quantum Electronics, vol. 3, No. 2; Apr. 1997; pp. 196–205.

(List continued on next page.)

Primary Examiner—David Nelms
Assistant Examiner—Thinh T Nguyen
(74) Attorney, Agent, or Firm—Fenwick & West LLP

(57) ABSTRACT

Quantum dot active region structures are disclosed. In a preferred embodiment, the distribution in dot size and the sequence of optical transition energy values associated with the quantum confined states of the dots are selected to facilitate forming a continuous optical gain spectrum over an extended wavelength range. In one embodiment, the quantum dots are self-assembled quantum dots with a length-to-width ratio of at least three along the growth plane. In one embodiment, the quantum dots are formed in quantum wells for improved carrier confinement. In other embodiments, the quantum dots are used as the active region in laser devices, including tunable lasers and monolithic multi-wavelength laser arrays.

32 Claims, 15 Drawing Sheets

OTHER PUBLICATIONS

Bossert, D.J.; and Gallant, D.; Improved Method For Gain/Index Measurements Of Semicondutor Lasers; Electronics Letters; vol. 32, No. 4; Feb. 15, 1996; pp. 338–339.

Bossert, David J.; and Gallant, David; Gain, Refractive Index, And α–Parameter In InGaAs–GaAs SQW BroadArea Lasers; IEEE Photonics Technology Letters, vol. 8, No. 3; Mar. 1996; pp. 322–324.

Brandt, O.; Ploog, K.; and Tapfer, L.; Formation And Morphology Of InAs/GaAs Herterointerfaces; Physical Review; vol. 45, No. 15; Apr. 15, 1992; pp. 8443–8452.

Brault, J.; Gendry, M.; Grenet, G.; and Hollinger, G.; Role Of Buffer Surface Morphology And Alloying Effects On The Properties Of InAs Nanostructures Grown On InP(001); Applied Physics Letters; vol. 73, No. 20; Nov. 16, 1998; pp. 2932–2934.

Brault, J.; Gendry, M.; Marty, O.; Pitaval, M.; Olivares, J.; Grenet, G.; and Hollinger, G.; Staggered Vertical Self–Organization Of Stacked InAs/InAlAs Quantum Wires On INP(001); Applied Surface Science; vol. 162–163; Aug. 2000; pp. 584–589.

Choo, Heung Ro; O, Beom–hoan; Park, Chong Dae; Kim, Hyung Mun; Kim, Jeong Soo; Oh, Dae Kon; Kim, Hong Man; and Pyun, Kwang Eui; Improvement Of Linewidth Enhancement Factor In 1.55–μm Multiple–Quantum–Well Laser Diodes; IEEE Photonics Technology Letters; vol. 10, No. 5; May 1998; pp. 645–647.

Chou, S.T.; Hsieh, K.C.; Cheng, K.Y.; and Chou, L.J.; Growth of $Ga_xIn_{1-x}As$ Quantum Wire Heterostructures By The Strain–Induced Lateral–Layer Ordering Process; J. Vac. Sci. Technol. B.; vol. 13, No. 2; Mar./Apr. 195; pp. 650–652.

Chyi, Jen–Inn; Nee, Tzer–En; Lee, Ching–Ting; Shieh, Jia–Lin; and Pan, Jen–Wei; Formation Of Self–Organized $In_{0.5}Ga_{0.5}As$ Quantum Dosts On GaAs By Molecular Beam Epitaxy; Journal Of Crystal Growth; vol. 175, 176; 1997; pp. 777–781.

Dutta, N.K.; Hobson, W.S.; Vakhshoori, D.; Han, H.; Freeman, P.N.; de Jong, J.F.; and Lopata, J.; Strain Compensated InGaAs–GaAsP–InGaP Laser; *IEEE Photonics Technology Letters;* vol. 8, No. 7; Jul. 1996; pp. 852–854.

Eliseev, P.G.; Li, H.; Liu, G.T.; Stintz, A.; Newell, T.C.; Lester, L.F.; and Malloy, K.J.; Gain In Ultra–Low–Threshold InAs/InGaAs Quantum Dot Lasers; Conference: 2000 IEEE 17th International Semiconductor Laser Conference; Sep. 25–28, 2000; pp. 65–66.

Eliseev, P.G.; Li, H.; Liu, G.T.; Stintz, Andreas; Newell, T.C.; Lester, L.F.; and Malloy, K.J.; Ground–State Emission And Gain In Ultralow–Threshold InAs–InGaAs Quantum-Dot Lasers; IEEE Journal On Selected Topics In Quantum Electronics; vol. 7, No. 2; Mar./Apr. 2001; pp. 135–142.

Eliseev, P.G.; Li, H.; Liu, G.T.; Stintz, A.; Newell, T.C.; Lester, L.F.; and Malloy, K.J.; Optical Gain In InAs/InGaAs Quantum –Dot Structures; Experiments And Theoretical Model; Quantum Electronics 30(8); 2000; pp. 664–668.

Eliseev, P.G.; Li, H.; Stintz, A.; Liu, G.T.; Newell, T.C.; Malloy, K.J.; and Lester, L.F.; Transition Dipole Moment Of InAs/InGaAs Quantum Dots From Experiments On Ultralow–Threshold Laser Diodes; Applied Physics Letters; vol. 77, No. 2; Jul. 10, 2000; pp. 262–264.

Eliseev, P.G.; Li, H.; Stintz, A.; Liu, G.T.; Newell, T.C.; Malloy, K.J.; and Lester, L.F.; Tunable Grating–Coupled Laser Oscillation And Spectral Hole Burning In An InAs Quantum–Dot Laser Diode; IEEE Journal Of Quantum Electronics; vol. 36, No. 4; Apr. 2000; pp. 479–485.

Fiore, A.; Borri; P.; Langbein, W.; Hvam, J.M.; Oesterle, U.; Houdre, R.; and Ilegems, M.; Time–Resolved Characterization Of InAs/InGaAs Quantum Dot Gain Material For 1.3 μm Lasers On Gallium Arsenide; CLEO 2000 Conference; May 2000; p. 348.

Gingrich, H.S.; Chumney, D.R.; Sun, S.–Z.; Hersee, S.D.; Lester, L.F.; and Brueck, S.R.J.; Broadly Tunable External Cavity Laser Diodes With Staggered Thickness Multiple Quantum Wells; IEEE Photonics Technology Letters; vol. 9, No. 2; Feb. 1997; pp. 155–157.

Gonzalez, L.; Garcia, J.M.; Garcia, R.; Briones; F.; Martinez–Pastor, J.; and Ballesteros, C.; Influence Of Buffer–Layer Surface Morphology On The Self–Organized Growth Of InAs On InP(001) Nanostructures; Applied Physics Letters; vol. 76, No. 9; Feb. 28, 2000; pp. 1104–1106.

Grundman, M.; and Bimberg, D.; Theory Of Random Population For Quantum Dots; Physical Review B; vol. 55, No. 15; Apr. 15, 1997; pp. 9740–9745.

Guo, S.P.; Ohno, H.; Shen, A.; Matsukura, F.; and Ohno, Y.; InAs Self–Organized Quantum Dashes Grown On GaAs (211)B; Appl. Phys. Letters, vol. 70, No. 20; May 19, 1997; pp. 2738–2740.

Hakki, Basil W.; and Paoli, Thomas L.; Gain Spectra In GaAs Double–Heterostructure Injection Lasers; Journal Of Applied Physics, vol. 46, No. 3; Mar. 1975; pp. 1299–1306.

Hinzer, K.; Fafard, S.; SpringThorpe, A.J.; Arlett, J.; Griswold, E.M.; Feng, Y.; and Charbonneau, S.; Room Temperature Operation Of AlInAs/AlGaAs Quantum Dot Lasers; Physica E, vol. 2; 1998; pp. 729–733.

Huang, X.; Stingz, A.; Hains, C.P.; Cheng, J.; and Malloy, K.J.; Efficient High–Temperature CW Operation Of Oxide Confined Long–Wavelength InAs Quantum Dot Lasers; CLEO 2000 Conference; May 2000; pp. 348–349.

Huang, Xiaodong; Stintz, A.; Hains, C.P.; Liu, G.T.; Cheng, J.; and Malloy, K.J.; Efficient High–Temperature CW Lasing Operation Of Oxide–Confined Long–Wavelength InAs Quantum Dot Lasers; Electronics Letters; vol. 36, No. 1; Jan. 6, 2000.

Huang, Xiaodong; Stintz, A.; Hains, C.P.; Liu, G.T.; Cheng, Julian; and Malloy, K.J.; Very Low Threshold Current Density Room Temperature Continuous–Wave Lasing From A Single–Layer InAs Quantum–Dot Laser, IEEE Photonics Technology Letters, vol. 12, No. 3; Mar. 2000; pp. 227–229.

Huang, Xiaodong; Stintz, A.; Hua, Li; Lester, L.F.; Cheng, Julian; and Malloy, K.J.; Demonstration Of Passive Q–Switching And Passive Mode–Locking In 1.3 μm Two-Section InAs Quantum Dot Lasers; Conference: CLEO 2001; May 2001; p. 359.

Huffaker, D.L.; and Deppe, D.G.; Electroluminescence Efficiency of 1.3 μm Wavelength InGaAs/GaAs Quantum Dots; Applied Physics Letters; vol. 73, No. 4; Jul. 27, 1998; pp. 520–522.

Kaspi, R.; and Evans, K.R.; Improved Compositional Abruptness At The InGaAs On GaAs Interface By Presaturation With In During Molecular–Beam Epitaxy; Appl. Phys. Lett.; vol. 67, No. 6; Aug. 7, 1995; pp. 819–821.

Kirstaedter, N.; Ledenstov, N.N.; Grundmann, M.; Bimberg, D.; Ustinov, V.M.; Ruvimov, S.S.; Maximov, M.V.; Kop'ev, P.S.; Alferov, Zh.I.; Richter, U.; Werner, P.; Gosele, U.; and Heydenreich, J.; Low Threshold, Large $T_0$ Injection Laser Emission From (InGa)As Quantum Dots; Electronics Letters, vol. 30, No. 17; Aug. 18, 1994; pp. 1416–1417.

Lester, Luke F.; Materials Growth And Device Characterization Of InAs Quantum Dot Lasers; Conference: LEOS; Nov. 15, 2000.

Lester, L.F.; Stintz, A.; Li, H.; Newell, T.C.; Pease, E.A.; Fuchs, B.A.; and Malloy, K.J.; Optical Characteristics Of 1.24–μm InAs Quantum–Dot Laser Diodes; IEEE Photonics Technology Letters, vol. 11. No. 8, Aug. 1999; pp. 931–933.

Li, H.; Liu, G.T.; Varangis, P.M.; Newell, T.C.; Stintz, A.; Fuchs, B.; Malloy, K.J.; and Lester, L.F.; 150–nm Tuning Range In A Grating–Coupled External Cavity Quantum–Dot Laser; 2000 CLEO Europe Conference; Sep. 2000.

Li, H.; Liu, G.T.; Varangis, P.M.; Newell, T.C.; Stintz, A.; Fuchs, B.; Malloy, K.J.; and Lester, L.F.; 150–nm Tuning Range In A Grating–Coupled External Cavity Quantum–Dot Laser, IEEE Photonics Technology Letters, vol. 12, No. 7, Jul. 2000; pp. 759–761.

Li, H.; Newell, T.C.; Liu, G.T.; Stintz, A.; Malloy, K.; and Lester, L.F.; Carrier Lifetime And Radiative Recombination In Quantum Dot LEDs; IEEE 2000 LEOS Annual Meeting; Nov. 2000; pp. 376–377.

Li, Y.F.; Lin, F.; Xu, B.; Liu, R.Q.; Ye, X.L.; Ding, D.; and Wang Z.G.; Influence Of Growth Conditions On Self–Assembled InAs Nanostructures Grown On (001)InP Substrate By Molecular Beam Epitaxy; Journal of Crystal Growth; vol. 223; 2001; pp. 518–522.

Li, Y.F.; Ye, X.L.; Xu, B.; Liu, F.Q.; Ding, D.; Jiang, W.H.; Sun, Z.Z.; Zhang, Y.C.; Liu, H.Y.; and Wang, Z.G.; Room Temperature 1.55 μm Emission From InAs Quantum Dots Grown on (001)InP Substrate By Molecular Beam Epitaxy; Journal Of Crystal Growth; vol. 218; 2000; pp. 451–454.

Li, Yue–Fa; Liu, Feng–Qi; Xu, Bo; Lin, Feng; Wu, Ju; Jiang, Wei–Hong; Ding, Ding; and Wang, Zhan–Guo; InAs Self–Assembled Nanostructures Grown On InP(001); Chinese Physics; vol. 9, No. 3; Mar. 2000; pp. 222–224.

Lian, G.D.; Yuan, J.; Brown, L.M.; Kim, G.H.; and Ritchie, D.A.; Modification Of InAs Quantum Dot Structure By The Growth Of The Capping Layer; Applied Physics Letters; vol. 73, No. 1; Jul. 6, 1998; pp. 49–51.

Liu, G.T.; Li, H.; Stintz, A.; Newell, T.C.; Lester, L.F.; and Malloy, K.J.; Modal Gain And $T_0$ Value Improvements In Quantum Dot Lasers Using Dots–In–A–Well (DWELL) Structure; IEEE 2000 International Semiconductor Laser Conference; pp. 133–134.

Liu, G.T.; Stintz, A.; Li, H.; Lester, L.F.; and Malloy, L.F.; Ultra–Low Threshold Current Density Quantum Dot Lasers Using The Dots–In–A–Well (DWELL) Structure; Conference: Physics And Simulation Of Optoelectronic Devices—Conference 8$^{th}$; Proceedings—SPIE The International Society For Optical Engineering; vol. 3944; 2000; pp. 814–822.

Liu, G.T.; Stintz, A.; Li, H.; Malloy, K.J.; and Lester, L.F.; Extremely Low Room–Temperature Threshold Current Density Diode Lasers Using InAs Dots In $In_{0.15}Ga_{0.85}As$ Quantum Well; Electronics Letters; vol. 35, No. 14; Jul. 8, 1999.

Liu, G.T.; Stintz, A.; Li, H.; Malloy, K.J.; and Lester, L.F.; 1.25 μm Low Threshold Current Density Dots–In–A–Well (DWELL) Lasers; Conference: 1999 Digest Of The LEOS Summer Topical Meetings: Nanostructures And Quantum Dots/WDM Components/VCSELs And Mirocavaties/RF Photonics For CATV and HFC Systems; Jul. 26–30, 1999.

Liu, G.T.; Stintz, A.; Li, H.; Newell, T.C.; Gray, A.L.; Varangis, P.M.; Malloy, K.J.; and Lester, L.F.; The Influence Of Quantum–Well Composition On The Performance Of Quantum Dot Lasers Using InAs/InGaAs Dots–In–A–Well (DWELL) Structures; IEEE Journal Of Quantum Electronics, vol. 36, No. 11; Nov. 2000; pp. 1272–1279.

Liu, G.T.; Stintz, A.; Li, H.; Newell, T.C.; Varangis, P.; Malloy, K.J.; and Lester, L.F.; One And Three–Stack Quantum Dot Lasers With Very Low Threshold Current Density; Conference: Conference On Lasers And Electo–Optics (CLEO 2000); 2000; May 2000; pp. 346–347.

Liu, Guangtian; Characteristics Of Ultralow Threshold Quantum–Dot Lasers Using InAs/InGaAs Dots–In–A–Well Structures; Thesis (Ph.D.); University of New Mexico; Dept. of Electrical And Computer Engineering; Dec. 2000; pp. 1–120.

Liu, Guangtian; Very Low Room–Temperature Threshold Current Density Dots In A Well (DWELL) Lasers; Conference: 1999 IEEE LEOS Annual Meeting Conference Proceedings. LEOS'99; 12 Annual Meeting; IEEE Lasers And Electo–Optics Society; Nov. 1999; vol. 2; pp. 469–470.

Lott, J.A. ; Ledentsov, N.N.; Ustimov, V.M.; Maleev, N.A., Zhukov, A.E.; Kovsh, A.R.; Maximov, M.V.; Volovik, B.V.; Alferov, Zh.I.; and Bimberg, D.; InAs–InGaAs Quantum Dot VCSELs On GaAs Substrates Emitting At 1.3 μm; Electronics Letters; vol. 36, No. 16; Aug. 3, 2000.

Marciante, John R.; and Agrawal, Govind P.; Spatio–Temporal Characteristics Of Filamentation In Broad–Area Semiconductor Lasers; IEEE Journal Of Quantum Electronics, vol. 33, No. 7; Jul. 1997; pp. 1174–1179.

Maximov, Mikhail V.; Kochnev, Igor V.; Shernyakov, Yuri M.; Zaitsev, Sergei V.; Gordeev, Nikita Yu.; Tsatsul'nikov, Andrew F.; Sakharov, Alexey V.; Krestnikov, Igor L.; Kop'ev, Petr S.; Alferov, Zhores I.; Ledenstov, Nikolai N.; Bimberg, Dieter; Kosogov, Alexander O.; Werner, Peter; and Gosele, Ulrich; InGaAs/GaAs Quantum Dot Lasers With Ultrahigh Characteristic Temperature ($T_0$=385K) Grown By Metal Organic Chemical Vapour Deposition; Jpn. J. Appl. Phys.; vol. 36, Pt. 1, No. 6B, 1997; pp. 4221–4223.

Mehuys, D.; Mittelstein, M.: Yariv, A.; Sarfaty, R.; and Ungar, J.E.; Optimised Fabry–Perot (AlGa)As Quantum–Well Lasers Tunable Over 105nm; Electronic Letters; vol. 25, No. 2; Jan. 19, 1989; pp. 143–145.

Mirin, R.; Gossard, A.; and Bowers, J.; Room Temperature Lasing From InGaAs Quantum Dots; Electronics Letters; vol. 32, No. 18; Aug. 29, 1996; pp. 1732–1734.

Morton, P.A.; Ackerman, D.A.; Shtengel, G.E.; Kazarinov, R.F.; Hybertsen, M.S.; Tanbun–Ek, T.; Logan, R.A.; and Sergent, A.M.; Gain Characteristics Of 1.55 μm High Speed Multiple–Quantum–Well Lasers; IEEE Photonics Technology Letters, vol. 7, No. 8; Aug. 1995; pp. 833–835.

Mukai, K.; Nakata, Y.; Otsubo, K.; Sugawara, M.; Yokoyama, N.; and Ishikawa, H.; High Characteristic Temperature Of Near–1.3 μm InGaAs/GaAs Quantum–Dot Lasers; CLEO 2000 Conference; May 2000 pp. 345–346.

Mukai, K.; Nakata, Y.; Shoji, H.; Sugawara, M.; Ohtsubo, K.; Yokoyama, N.; and Ishikawa, H.; Lasing With Low Threshold Current And High Output Power From Columnar–Shaped InAs/GaAs Quantum Dots; Electronics Letters; vol. 34, No. 16; Aug. 6, 1998, pp. 1588–1590.

Mukai, Kohki; Ohtsuka, Nobuyuki; Shoji, Hajime; and Sugawara, Mitsuru; Growth And Optical Evaluation Of InGaAs/GaAs Quantum Dots Self–Formed During Alternate Supply Of Precursors; Applied Surface Science; vol. 112; Mar. 1997; pp. 102–109.

Mukai, Kohki; Ohtsuka, Nobuyuki; Sugawara, Mitsuru; and Yamazaki; Susumu; Self–Formed $In_{0.5}Ga_{0.5}As$ Quantum Dots On GaAs Substrates Emitting At 1.3 μm; Jpn. J. Appl. Phys. vol. 33, Part 2, No. 12A; Dec. 1, 1994; pp. 1710–1712.

Newell, T.C.; Bossert, D.J.; Stintz, A.; Fuchs, B.; Malloy, K.J.; and Lester, L.F.; Gain And Linewidth Enhancement Factor In InAs Quantum–Dot Laser Diodes; IEEE Photonics Technology Letters; vol. 11, No. 12; Dec. 1999; pp. 1527–1529.

Newell, T.C.; Li, H.; Eliseev, P.; Liu, G.T.; Stintz, A.; Malloy, K.J.; and Lester, L.F.; Broadening Mechanisms, Gain, And Low Linewidth Enhancement Factor In InAs Quantum Dot Lasers; Conference: CLEO 2000; May 2000; p. 363.

Newell, T.C.; Li, H.; Stintz, A.; Bossert, D.; Fuchs, B.; Malloy, K.J.; and Lester, L.F.; Optical Characteristics And Low Linewidth Enhancement Factor in 1.2 $\mu$m Quantum Dot Lasers; Conference: 1999 IEEE LEOS Annual Meeting Conference Proceedings; LEOS'99; $12^{th}$ Annual Meeting; IEEE Lasers And Electro–Optics Society 1999 Annual Meeting; Nov. 8–11, 1999.

Newell, T.C.; Varangis, P.; Pease, E.; Liu, G.T.; Stintz, A.; Malloy, K.; and Lester L.F.; 1.5 $\mu$m AlGaInAs Quantum Well Lasers Grown By The Digital Alloy Technique; Conference: CLEO 2000; May 2000; pp. 174–175.

Nishi, Kenichi; Saito, Hideaki; and Sugou, Shigeo; A Narrow Photoluminescence Linewidth of 21 meV at 1.35 $\mu$m From Strain–Reduced InAs Quantum Dots Covered by $In_{0.2}Ga_{0.8}As$ Grown On GaAs Substrates; Applied Physics Letters; vol. 74, No. 8; Feb. 22, 1999; pp. 1111–1113.

Park, G.; Shchekin, O.B.; Huffaker, D.L.; and Deppe, D.G.; Very Low Threshold Oxide–Confined 1.3 $\mu$m GaAs–Based Quantum Dot Laser; CLEO 2000 Conference; May 2000; pp. 349–350.

Park, Gyounwon; Shchekin, Oleg B.; Csutak, Sebastian; Huffaker, Diana L.; and Deppe, Dennis G.; Room–Temperature Continuous–Wave Operation Of A Single–Layered 1.3 $\mu$m Quantum Dot Laser, Applied Physics Letters, vol. 75, No. 21; Nov. 22, 1999; pp. 3267–3269.

Prieto, J.A.; Armelles, G.; Priester, C.; Garcia, J.M.; Gonzalez, L.; and Garcia, R.; Strain–Induced Optical Anisotropy In Self–Organized Quantum Structures At The $E_1$ Transition; Applied Physics Letters; vol. 76, No. 16; Apr. 17, 2000; pp. 2197–2199.

Qiu, Y.; Gogna, P.; Forouhar, S.; Stintz, A.; and Lester, L.F.; High–Performance InAs Quantum Dot Lasers Near 1.3 $\mu$m; Applied Physics Letters; vol. 79, No. 22; Nov. 26, 2001; pp. 3570–3572.

Qiu, Y.; Gogna, P.; and Forouhar, S.; High Temperature Continuous Wave Operation Of InAs Quantum Dot Lasers Near 1.3 $\mu$m; Conference: IEEE Lasers & Electro–Optics Society; LEOS Conference; Nov. 12–16, 2001; pp. 267–268.

Sakaki, Hiroyuki; Quantum Wires, Quantum Boxes And Related Structres; Physics, Device Potentials And Structural Requirements; Surface Science; vol. 267; 1992; pp. 623–629.

Shernyakov, Yu.M.; Bedarev, D.A.; Kondrat'eva, E.Yu.; Kop'ev, P.S.; Kovsh; A.R.; Maleev, N.A.; Maximov, M.V.; Mikhrin, S.S.; Tsatsul'nikov, A.F.; Ustinov, V.M.; Volovik, B.V.; Zhukov, A.E.; Alferov, Zh.I.; Ledenstov, N.N.; and Bimberg, D.; 1.3 $\mu$m GaAs–Based Laser Using Quantum Dots Obtained By Activated Spinodal Decomposition; Electronics Letters; vol. 35, No. 11; May 27, 1999; pp. 898–900.

Shoji, H.; Mukai, K.; Ohtsuka, N.; Sugawara, M.; Uchida, T.; and Ishikawa, H.; Lasing At Three–Dimensionally Quantum–Confined Sublevel Of Self–Organized $In_{0.5}Ga_{0.5}As$ Quantum Dots By Current Injection; IEEE Photonics Technology Letters, vol. 7, No. 12; Dec. 1995; pp. 1385–1387.

Stintz, A.; Liu, G.T.; Gray, A.L.; Spillers, R.; Delgado, S.M.; and Malloy, K.J.; Characterization Of InAs Quantum Dots In Strained $In_xGa_{1-x}As$ Quantum Wells; J.Vac.Sci.Technol.; vol. B 18(3); May/Jun. 2000; pp. 1496–1501.

Stintz, A.; Liu, G.T.; Li, H.; Lester, L.F.; and Malloy, K.J.; Low–Threshold Current Density 1.3–$\mu$m InAs QuantumDot Lasers With The Dots–In–A–Well (DWELL) Structure; IEEE Photonics Technology Letters; vol. 12, No. 6; Jun. 2000; pp. 591–593.

Tabuchi, H.; and Ishikawa H.; External Grating Tunable MQW Laser With Wide Tuning Range Of 240nm; Electronic Letters; vol. 26, No. 11; May 24, 1990; pp. 742–743.

Thomson, J.D.; Herrmann, E.; Summers, H.D.; Smowton, P.M.; and Hopkinson, M.; Temperature Insensitive Quantum Dot Structures For Vertical Cavity Lasers; CLEO 2000 Conference; May 2000; pp. 347–348.

Ustinov, V.M.; Maleev, N.A.; Zhukov, A.E.; Kovsh, A.R.; Egorov, A.Yu.; Lunev, A.V.; Volovik, B.V.; Krestnikov, I.L.; Musikhin, Yu.G.; Bert, N.A.; Kop'ev, P.S.; and Alferov, Zh.I.; InAs/InGaAs Quantum Dot Structures On GaAs Substrates Emitting at 1.3 $\mu$m; Applied Physics Letters; vol. 74, No. 19; May 10, 1999; pp. 2815–2817.

Varangis, P.M.; Li, H.; Liu, G.T.; Newell, T.C.; Stintz; A.; Fuchs, B.; Malloy, K.J.; and Lester, L.F.; Low–Threshold Quantum Dot Lasers With 201nm Tuning Range; Electronics Letters; vol. 26, No. 18; Aug. 31, 2000.

Varangis, P.M.; Li, H.; Liu, G.T.; Newell, T.C.; Stintz; A.; Fuchs, B.; Malloy, K.J.; and Lester, L.F.; 183 nm Tuning Range In A Grating–Coupled External–Cavity Quantum Dot Laser; IEEE 2000 International Semiconductor Laser Conference; pp. 137–138.

Wang, R.H.; Stintz, A.; Rotter, T.J.; Malloy, K.J.; and Lester, L.F.; Low Threshold Oxide–Confined InAs Quantum Dash Ridge Waveguide Lasers On InP Substrates; Conference: IEEE Lasers & Electro–Optics Society; LEOS Conference; Nov. 12–16, 2001; pp. 405–406.

Wang, R.H.; Stintz, A.; Varangis, P.M.; Newell, T.C.; Li, H.; Malloy, K.J.; and Lester, L.F.; Room–Temperature Operation Of InAs Quantum–Dash Lasers On InP (001); IEEE Photonics Technology Letters; vol. 13, No. 8; Aug. 2001; pp. 767–769.

Wang, Ronghua; Stintz, A.; Varangis, P.M.; Newell, T.C.; Li, H.; Lester, L.F.; and Malloy, K.J.; 1.6 $\mu$m Single And Multiple–Stack Room Temperature Quantum Dash Lasers On InP; Conference: CLEO (Conference on Lasers And Electro Optics)/QELS Plenary Session And Awards Ceremony; May 9, 2001.

Wang, Zhanguo; Liu, Fengqi; Liang, Jiben; and Xu, Bo; Self–Assembled InAs/GaAs Quantum Dots And Quantum Dot Laser, Science in China; vol. 43, No. 8; Aug. 2000; pp. 861–870.

Wasilewski, Z.R.; Fafard, S.; and McCaffrey J.P.; Size And Shape Engineering Of Vertically Stacked Self–Assembled Quantum Dots; Journal Of Crystal Growth; vol. 201, 202; 1999; pp. 1131–1135.

Willatzen, M.; Tanaka, T.; Arakawa, Y.; and Singh, J.; Polarization Dependence Of Optoelectronic Properties In Quantum Dots And Quantum Wires—Consequences Of Valence–Band Mixing; IEEE Journal of Quantum Eletronics; vol. 30, No. 3; Mar. 1994; pp. 640–653.

Zhukov, A.E.; Kovsh, A.R.; Egorov, A.Yu.; Maleev, N.A., Ustinov, V.M.; Volovik, B.V.; Maksimov, M.V.; Tsatsul'nikov, A.F.; Ledenstov, N.N.; Shernyakov, Yu.M.; Lunev, A.V., Musikhin, Yu.G.; Bert, N.A.; Kop'ev, P.S.; and Alferov, Zh.I.; Photo And Electoluminescence In The 1.3 $\mu$m Wavelength Range From Quantum–Dot Structures Grown On GaAs Substrates; Semiconductors; vol. 33, No. 2; Feb. 1999; pp. 153–156.

* cited by examiner

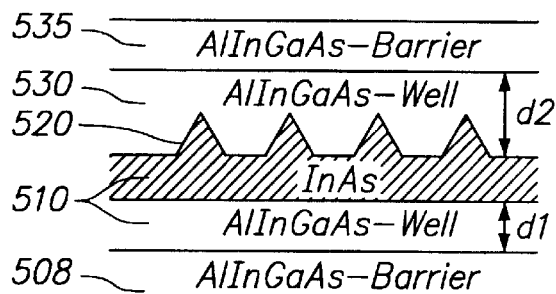
FIG. 5
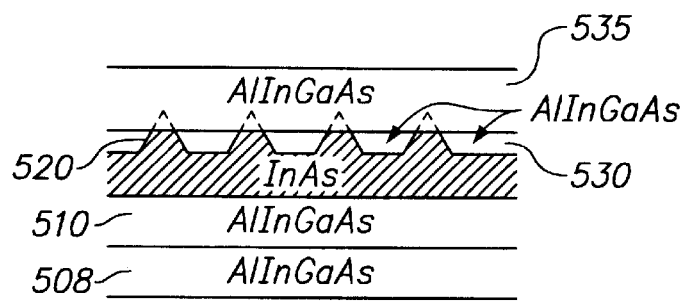
FIG. 6
| 750 | InGaAs | 0.06μm | p⁺-doped | |
|---|---|---|---|---|
| 745 | InAlAs | 1.8μm | p-doped | |
| 740 | AlGaInAs | 0.2μm | undoped | |
| 735 | AlGaInAs | barrier | | |
| 730 | AlGaInAs | well | | |
| 725 | InAs | quantum dash | | X 1~5 |
| 720 | AlGaInAs | well | | |
| 715 | AlGaInAs | barrier | | |
| 710 | AlGaInAs | 0.2μm | undoped | |
| 705 | InAlAs | 1.8μm | n-doped | |
| 702 | InP | substrate | n-doped | |
FIG. 7A

| | |
|---|---|
| 750 | 1000 Å p-$In_{0.53}Ga_{0.47}As$, $1.5E19cm^{-3}$ |
| 748 | 177 Å graded from p-$Al_{0.48}In_{0.52}As$ to p-$In_{0.53}Ga_{0.47}As$, $1.5E19cm^{-3}$ |
| 745 | 1.8 µm p-$Al_{0.48}In_{0.52}As$, $1E17\ cm^{-3}$ |
| 740 | 1050 Å undoped $Al_{0.2}Ga_{0.27}In_{0.53}As$ (λ=1.2µm) |
| 735 | 150 Å undoped $Al_{0.18}Ga_{0.32}In_{0.5}As$ (λ=1.2µm) |
| 730 | 63 Å undoped $Al_{0.2}Ga_{0.15}In_{0.65}As$ (λ=1.3µm) |
| 725 | 9 Å undoped InAs |
| 720 | 12 Å undoped $Al_{0.2}Ga_{0.15}In_{0.65}As$ (λ=1.3µm) |
| 715 | 150 Å undoped $Al_{0.18}Ga_{0.32}In_{0.5}As$ (λ=1.2µm) |
| 710 | 1050 Å undoped $Al_{0.2}Ga_{0.27}In_{0.53}As$ (λ=1.2µm) |
| 705 | 1.0 µm n-$Al_{0.48}In_{0.52}As$, $1E17\ cm^{-3}$ |
| 704 | 30 Å graded from n-$Al_{0.38}Ga_{0.1}In_{0.52}As$ to n-$Al_{0.48}In_{0.52}As$, $1E18cm^{-3}$ |
| 702 | n-InP substrate |

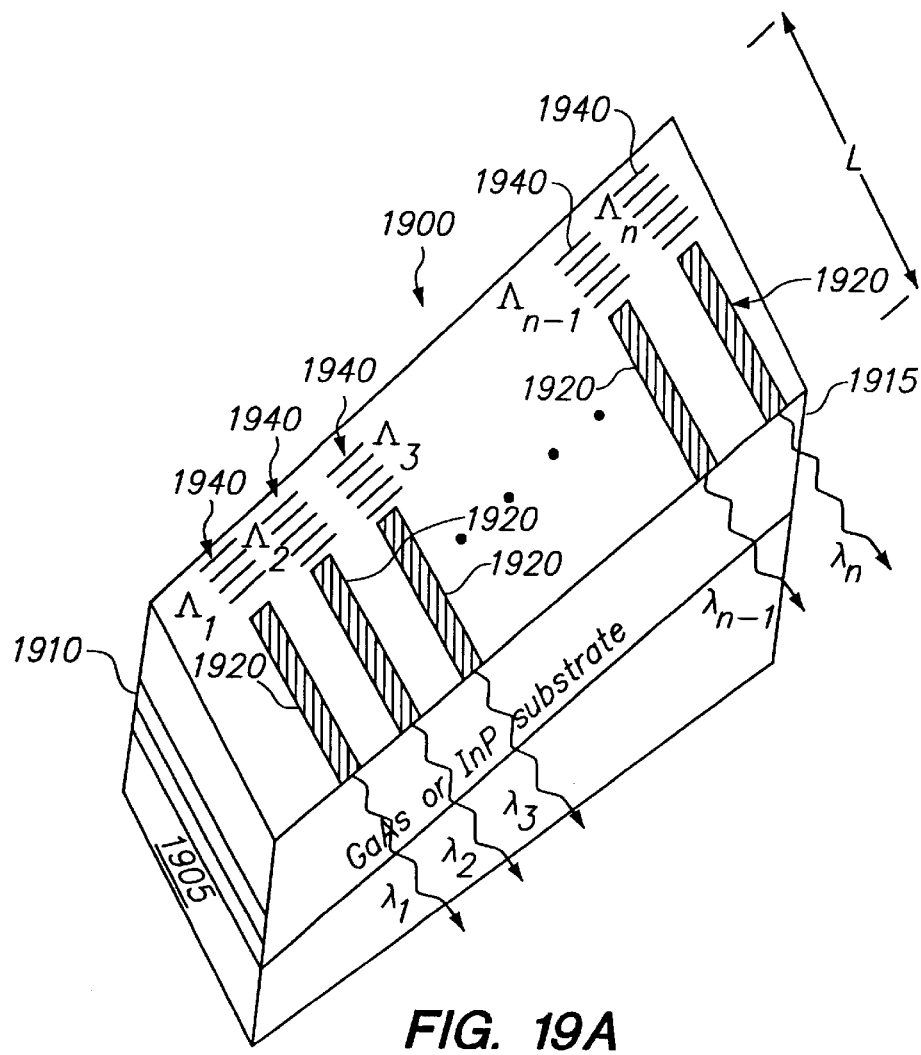
FIG. 19A
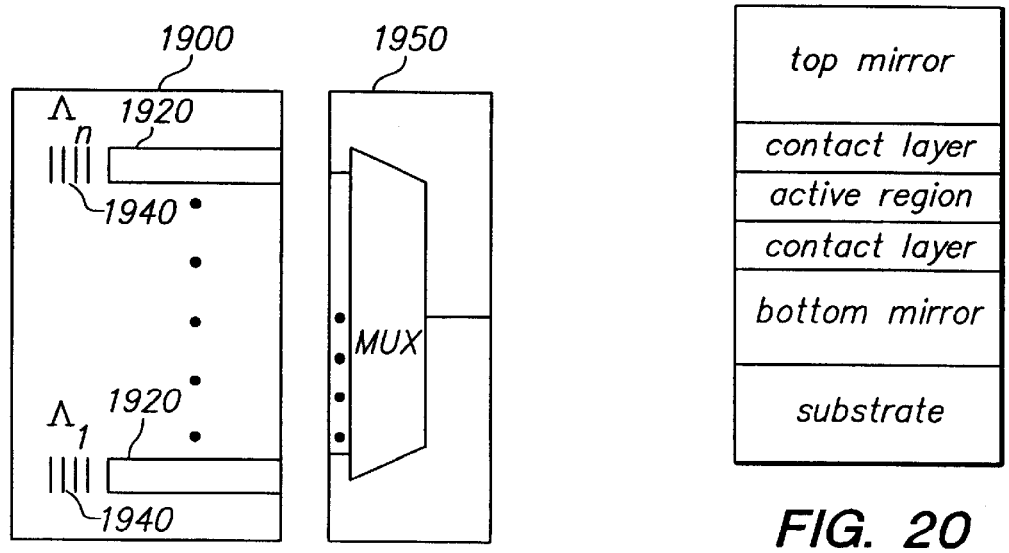
FIG. 19B
FIG. 20

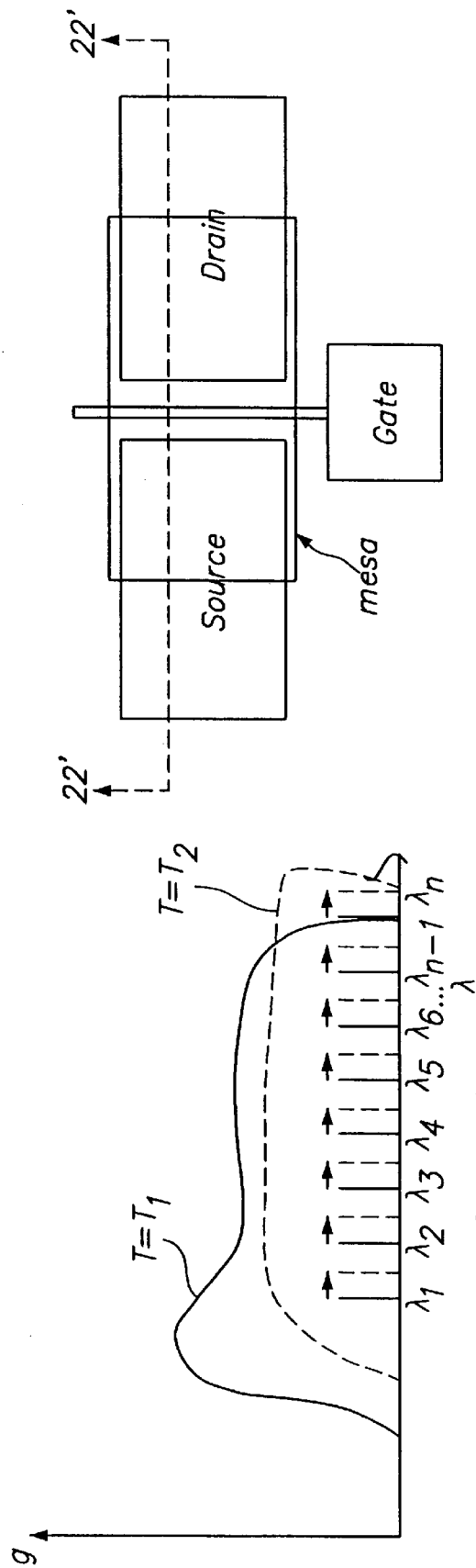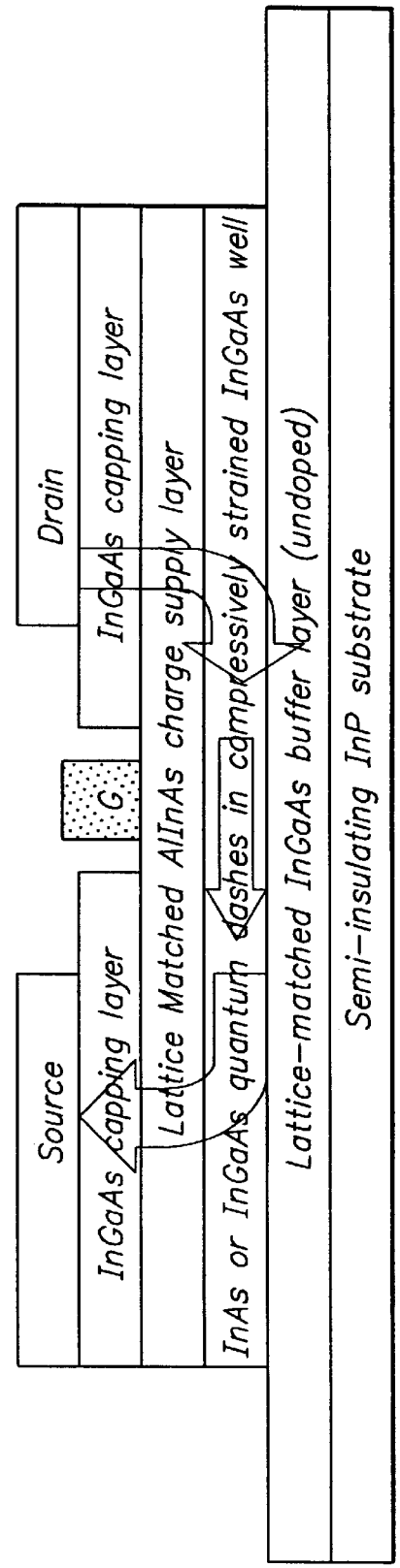

QUANTUM DASH DEVICE

RELATED APPLICATIONS

This application claims priority under 35 U.S.C. §119(e) to the following U.S. Patent Application Nos.: 60/234,344 entitled "Self-Organized Quantum-Dash Growth And Ordered Quantum-Dot Growth and Semi-Conductor Lasers and Transistors Formed From These Structures," filed Sep. 22, 2000; 60/238,030 entitled "Broadband Continuously Tunable-Wavelength Quantum Dot and Quantum Dash Semiconductor Lasers with Low-Threshold Injection Current" filed Oct. 6, 2000; 60/252,084 entitled "Quantum Dot and Quantum Dash Semiconductor Lasers For Wavelength Division Multiplexing (WDM) System Applications" filed Nov. 21, 2000; 60/276,186, entitled "Semiconductor Quantum Dot Laser Active Regions Based On Quantum Dots in a Optimized Strained Quantum Well," filed Mar. 16, 2001; 60/272,307, entitled "Techniques for Using Quantum Dot Active Regions In Vertical Cavity Surface Emitting Lasers," filed Mar. 2, 2001; 60/316,305 ,entitled "Quantum Dot And Quantum Dash Active Region Devices," filed Aug. 31, 2001 The contents of all of the above applications are hereby each incorporated by reference in their entirety in the present patent application.

STATEMENT AS TO FEDERALLY SPONSORED RESEARCH AND DEVELOPMENT

The U.S. Government may have certain rights in this invention pursuant to research conducted under the following grants: Grant No. F49620-95-1-0530 awarded by the Air Force Office Of Science and Research, Grant No. DAAL01-96-02-0001 awarded by the Army Research Lab, Grant No. F4920-99-1-330 awarded by the Air Force Office of Science and Research, and Grant No. MDA972-98-1-0002 awarded by the Defense Advanced Research Projects Agency.

BACKGROUND OF THE INVENTION

1. Field of the Invention

The present invention relates generally to self-assembled semiconductor quantum dot devices. More particularly, the present invention is directed towards self-assembled quantum dot devices for use in opto-electronic devices.

2. Description of Background Art

Quantum dot and quantum wire semiconductors structures are of interest for a variety of electronic and opto-electronic device applications. A semiconductor quantum dot is a structure having energy barriers that provide quantum confinement of electrons and holes in three dimensions. A semiconductor quantum wire is a structure having energy barriers that provide quantum confinement of electrons and holes along two dimensions.

Theoretical studies indicate that quantum dot and quantum wire lasers have many potential performance advantages over conventional quantum well lasers. First, a quantum dot or quantum wire laser has a lower fill factor (volume of material to be pumped) and an improved density of states function compared with a quantum well laser. Referring to FIG. 1, the theoretical density of states function become sharper as the carrier dimensionality decreases. FIG. 1A shows a theoretical density of states function for a bulk material, which has a square root dependence on energy. FIG. 1B shows the theoretical density of states function for a quantum well (one dimension of quantum confinement) which increases in steps at each quantum well energy level. FIG. 1C shows the theoretical density of states function for a quantum wire (two dimensions of quantum confinement). FIG. 1D shows the theoretical density of states function for a quantum dot (three dimensions of quantum confinement) which has a delta-like density of states function (e.g., a finite number of states available only at the quantum dot). Theoretical calculations indicate that the threshold current of a semiconductor laser may be improved by using quantum dot active regions due to the smaller volume of material and reduced number of states.

Quantum wire and quantum dot lasers emitting light in the 1.3 to 1.6 micron wavelength range are of particular interest for fiber optic communication systems. Commonly, InGaAsP is used to fabricate long wavelength quantum well lasers. Conventional approaches to fabricating quantum dots in InGaAsP include etching and regrowth techniques to pattern and embed InGaAsP quantum dots. Unfortunately, the drawbacks of conventional approaches to fabricating quantum dot and quantum wire lasers have limited the commercial applications of quantum dots, particularly in the 1.3 to 1.6 micron emission wavelength range. One potential problem in fabricating quantum dot and quantum wire lasers is deleterious non-radiative interface recombination. Quantum dots and quantum wires have a large surface-to-volume ratio which render them especially sensitive to interface defects. Additionally, the small fill factor of quantum dot and quantum wire active regions can cause significant current leakage, i.e., a significant fraction of the laser drive current is not injected into the quantum dots or quantum wires and/or is depleted from the quantum structure by thermionic emission.

The drawbacks of conventional quantum dot laser fabrication methods can result in a threshold current that is much greater than the theoretical limit. Additionally, these same drawbacks can make it difficult to form semiconductor active regions capable of lasing over a wide wavelength range. In conventional quantum well lasers, the peak of the gain spectrum shifts to shorter wavelengths as the carrier density in the quantum well increases. This permits an approximately 30–75 nanometer tuning range in external cavity lasers by adjusting the threshold gain level. Similarly, conventional quantum well lasers have a shift in gain spectrum with carrier density that permits an approximately 10 nanometer wavelength tuning range in temperature tuned distributed feedback lasers. However, in a quantum dot laser, non-radiative interface combination and current leakage can be a particularly severe problem for quantum dot lasers having a high threshold gain because the correspondingly larger quasi-Fermi levels at high gain levels may result in a high percentage of leakage current and substantial non-radiative interface recombination. These deleterious effects can limit the ability to use a quantum dot laser structure over a large wavelength range.

What is desired are improved quantum dot structures for opto-electronics applications.

SUMMARY OF THE INVENTION

Quantum dot active region opto-electronic devices are disclosed. The quantum dot active region devices have a sequence of quantum confined energy states and a distribution in dot size that facilitates forming a continuous optical gain spectrum over an extended wavelength range. In one embodiment, the quantum dots are self-assembled quantum dots that form elongated in one direction of the growth plane. In a preferred embodiment, the mean length of the quantum dots is at least about three times their width. The distribution in dot size is preferably selected so that the inhomogenous gain broadening is at least comparable to the homogenous gain broadening. In one embodiment, the mean dot size is selected so that the optical transition energy value associated with the first excited quantum confined state is less than 30 meV greater than the optical transition energy value associated with the ground state. The quantum dot active region may be utilized in a variety of opto-electronic devices that benefit from a broad optical gain spectrum, such as tunable wavelength lasers and monolithic multi-wavelength laser arrays.

BRIEF DESCRIPTION OF THE DRAWINGS

FIG. 5 illustrates a growth sequence for embedding quantum dashes.

FIG. 6 illustrates a growth sequence for embedding quantum dashes.

FIG. 7A is a first growth sequence for quantum dash lasers.

FIG. 12A shows experimental plots of electroluminescence intensity as a function of wavelength for a LED with a quantum dash active region operated at several different current densities whereas FIG. 12 is an illustrative diagram of tuning range as function of current density.

FIG. 19A is a perspective view of a multi-wavelength laser array.

FIG. 19B is a top view of the multi-wavelength array coupled to an optical combiner as part of a wavelength division multiplexed system.

FIG. 19C illustrates temperature tuning of the array of FIG. 19A.

FIG. 20 illustrates major portions of a VCSEL having a quantum dash active region.

FIG. 21 is a top view of a quantum dash transistor structure.

FIG. 22 is a cross-section view of the quantum dash transistor structure of FIG. 21 along line 21—21.

DETAILED DESCRIPTION OF THE PREFERRED EMBODIMENTS

Figure 1A:
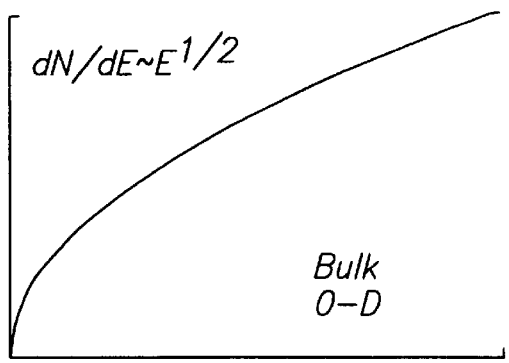
FIGS. 1A, 1B, 1C, and 1D illustrate the density of states function for bulk semiconductors, quantum wells, quantum wires, and quantum dots, respectively.
Figure 1B:
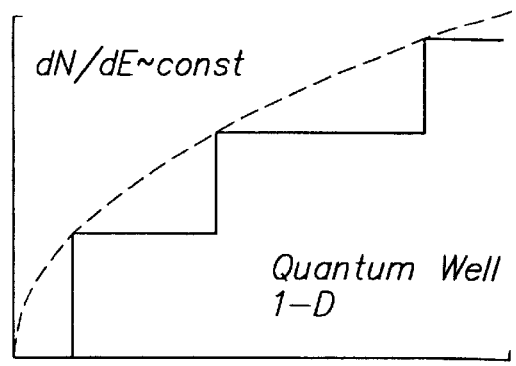
Figure 1C:
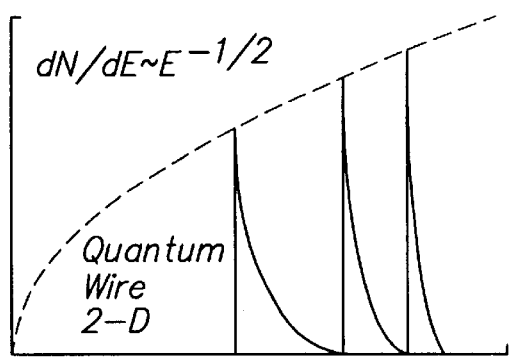
Figure 1D:
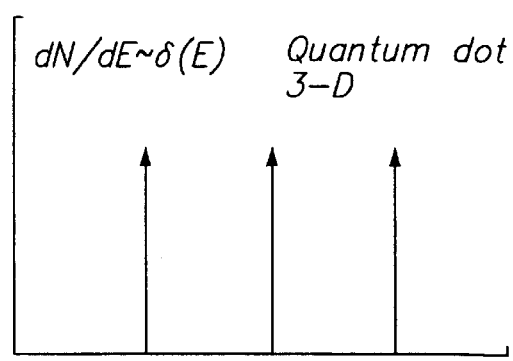
Figure 2A:
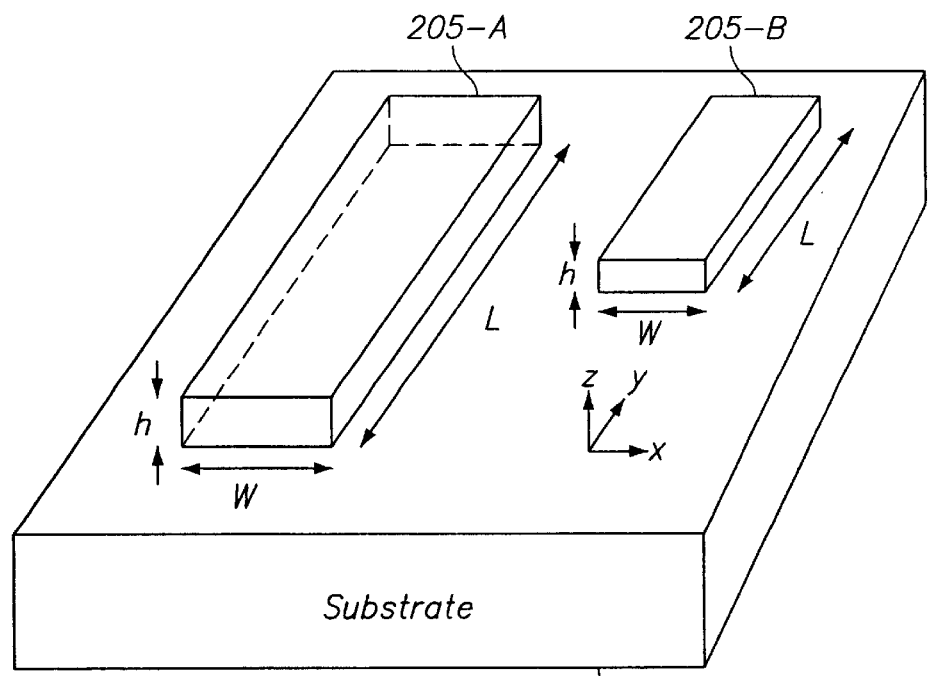
FIG. 2A is a perspective view of the core region of an idealized quantum dash.
Figure 2B:
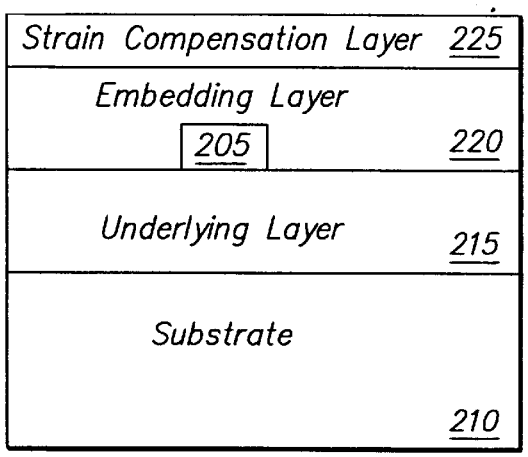
FIG. 2B is a side view of an embedded quantum dash.
Figure 2C:
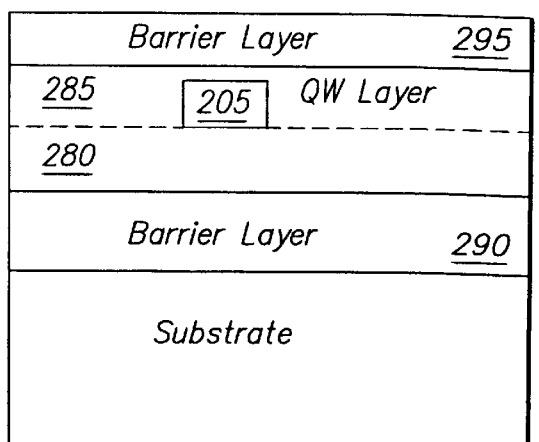
FIG. 2C is a side view of a quantum dash embedded in a quantum well.

The present invention is directed towards the fabrication of quantum dots for use in opto-electronic devices, such as optical amplifiers, discrete lasers, tunable lasers, and monolithic arrays of lasers, although it will be understood that the quantum dots have other applications as well. In one embodiment, the quantum dots are self-assembled quantum confined nanostructures that the inventors refer to as "quantum dashes." FIG. 2A is a perspective view illustrating the dimensions of the core regions of quantum dashes. The quantum dashes 205 are elongated quantum dots having a mean height, h, width, w and length, l, as shown in FIG. 2A. In one embodiment, each of the three dimensions (h, w, and l) of the quantum dash is selected to be less than the room temperature thermal de Broglie wavelength. Generally speaking, the core regions of the quantum dashes comprises a plurality of spaced apart mesas, such as core regions 205-A and 205-B formed on a semiconductor substrate 210. However, it will be understood that the core regions of the quantum dashes may include a distribution of quantum dot shapes other than elongated mesas. As indicated in the side view of FIG. 2B, typically an underlying layer 215 is first formed on a substrate 210. The quantum dashes 205 are embedded in an embedding layer 220. Additional layers, such as a strain compensation layer 225, may also be grown. As shown in the side view of FIG. 2C, the quantum dashes 205 may be formed in quantum wells comprising a bottom barrier layer 290, first and second quantum well layers 280, 285, and a top barrier layer 295. The material composition of the layers is preferably selected such that the lattice mismatch of thick layers is lattice matched or nearly lattice matched (e.g., less than the critical thickness for dislocation formation) to prevent the formation of deleterious misfit dislocations. It will be understood, however, that the dashes and individual layers may be pseudomorphic strained layers.

Referring again to FIG. 2A, the height of the core region of a quantum dash 205 is measured in a direction perpendicular to the plane of the substrate 210 along a z-axis corresponding to the direction of growth. Consequently, it will be understood that the height, h, may also be referred to as a thickness with respect to the thickness of other grown layers (e.g., grown layers along the z-axis are commonly described by a growth thickness). The length and width are measured in x, y directions parallel to the growth plane (i.e., a plane parallel to the plane of the substrate). In one embodiment, typical values of the height are in the range of about 2–12 nanometers (hereinafter "nm"). The height, h, of each quantum dash is preferably equal to or less than its width (e.g., typical values of the width are in the range of 10–30 nm). In one optical device embodiment, the mean value of the ratio of the length-to-width of the dashes is preferably selected so that the quantum dash has a ground state energy level that saturates at room temperature and with a sequence of excited states that have an energy level separation that facilitates forming a high, broad optical gain spectrum. In one embodiment, the mean length-to-width ratio of the quantum dashes is in the range of 3:1 to 20:1. As described below in more detail, the quantum dashes have some of the desirable properties of both conventional quantum dots and quantum wires, making them useful in a variety of electronic and optical devices.

In a preferred embodiment, the quantum dashes are fabricated as self-assembled structures (sometimes also known as "self-organized structures") in the III–V compound semiconductor materials system. In the III–V compound semiconductor system the group III element may comprise Al, Ga, or In, whereas the group V element may comprise at least one of the elements N, P, As or Sb. Relationships between bandgap energy and the lattice constant of different III–V compounds are well known by those in the art such that it will be understood that the present invention may be practiced with a variety of III–V semiconductor alloy compositions. GaAs and InP are the most commonly used III–V compound semiconductor substrates, although other types of substrates may also be used as well. Self-assembled nanostructures may be fabricated using a variety of crystal growth techniques that have sufficient surface kinetic reactions (e.g., surface ad-atom or molecular migration) that favor island growth in response to the growth of a higher lattice constant material upon a lower lattice constant material, including growth techniques such as molecular beam epitaxy (MBE), gas source MBE (GSMBE), metallo-organic chemical vapor deposition (MOCVD). The island growth of conventional quantum dots is typically in the shape of dots having a length that is not more than twice its width. Additionally, under certain circumstances self-assembled quantum wire nanostructures form. See, e.g., J. Brault et al., "Role of buffer surface morphology and alloying properties on the properties of InAs nanostructures grown on InP (001)," *Appl. Phys. Lett.,* vol. 73, no. 20, pp. 2932–2934, November 1998. Self-assembled wire formation is attributed to orientation-dependent surface diffusion and orientation-dependent step edges that influence growth rates along preferred crystal direction. However in accord with a preferred embodiment of the present invention, growth conditions are selected to achieve the intermediate result of elongated quantum dots which are not continuous quantum wires and which have a length-to-width ratio of at least 3.

Figure 3A:
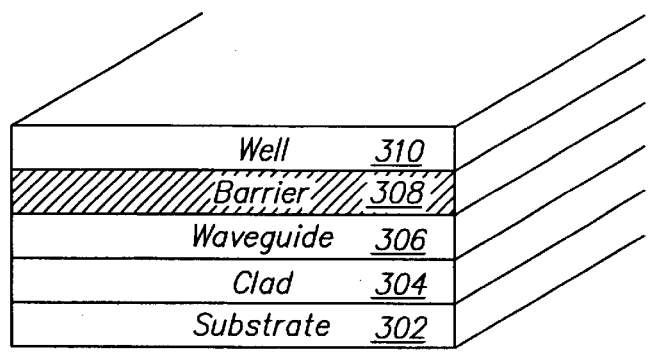
FIGS. 3A, 3B, and 3C are perspective views illustrating some of the steps used to form a quantum dash laser.

FIGS. 3A–3D illustrated some aspects of the fabrication of self-assembled quantum dashes. Referring to FIG. 3A, a substantially planar III–V compound semiconductor support layer 310 having a first bandgap energy is grown, such as a layer of AlGaInAs or InGaAsP. The support layer may be grown either directly on a substrate (e.g., a (100) InP substrate) or upon other layers previously grown on the substrate. As described below in more detail, in one embodiment the support layer is a first portion of a quantum well grown on an underlying barrier layer 308, a waveguide layer 306, and a cladding layer 304. In one embodiment, the growth parameters of the support layer are selected to achieve a mean surface roughness of less than 0.3 nm.

Figure 3B:
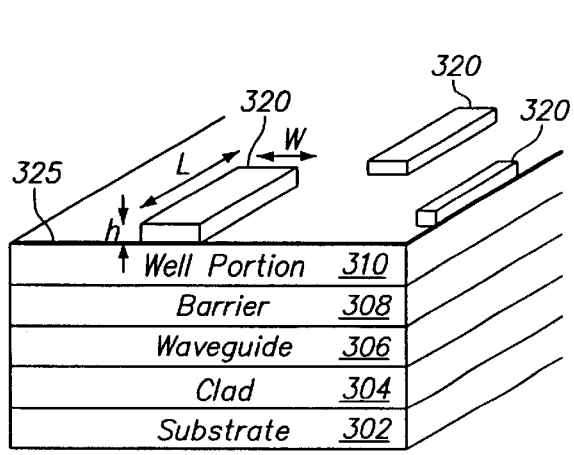

Referring to FIG. 3B, growth parameters are selected to form self-assembled islands 320 during deposition of a second lower bandgap compound semiconductor having a larger relaxed lattice constant than the underlying layer (e.g., a layer of InAs grown on AlGaInAs). In particular, the lattice mismatch of the lower bandgap semiconductor is preferably selected to be at least about 1.8% greater than the underlying semiconductor layer to produce a Stranski-Krastanow (S-K) growth mode. In the S-K growth mode, the driving force for the formation of islands is the reduction in strain energy afforded by elastic deformation, i.e., for S-K growth it is more energetically favorable to increase surface energy by islanding than by relaxing strain by dislocation generation. In a S-K growth mode, the growth becomes three dimensional after a critical thickness of the larger lattice constant material is grown upon an initial wetting layer. In conventional S-K growth, dot-shaped islands tend to form that have a length-to-width ratio typically between about 1:1 to 2:1. In a preferred embodiment of the present invention, the substrate orientation, composition of the underlying layers, and growth factors affecting the surface kinetics (e.g., growth rate and temperature) are selected to favor the coalescence of dot shaped islands into elongated islands that have a mean length-to-width ratio of at least 3:1. As described below in more detail, appropriate selection of the growth parameters permits control over the height and the length-to-width ratio of the dashes.

Figure 3C:
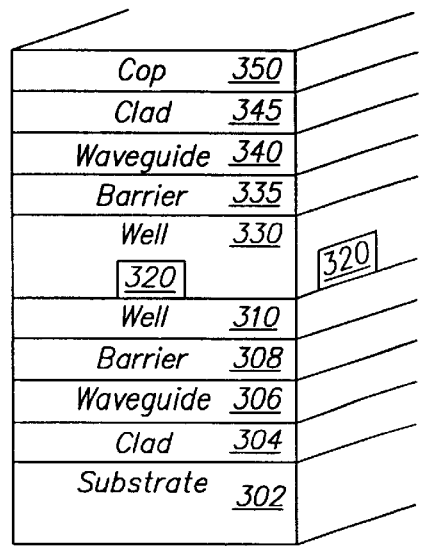

As shown in the illustrative diagram of FIG. 3B, each island 320 of low bandgap semiconductor is an elongated quantum dot that has a nominal height, width and length. The islands tend to be aligned along a preferred crystal orientation. A residual wetting layer 325 may remain on the surface of well portion 310. After the self-assembled islands are formed, they are embedded in a third, higher bandgap material 330 (e.g., a layer of AlGaInAs or InGaAsP) to form a quantum dash as shown in FIG. 3C. It will be understood that interdiffusion, phase segregation, and spinodal decomposition during the embedding process need to be taken into account because they may affect the shape and composition of the quantum dashes. In one embodiment, the quantum dashes are embedded in a second well portion 330, followed by a second barrier layer 335, waveguide layer 340, clad layer 345, and cap layer 350. Each quantum dash thus consists of an elongated island of low bandgap material surrounded on all sides by a higher bandgap material. It will be understood that once a planar surface is restored that additional quantum dashes may be formed if desired by repeating the island formation process.

A preferred epitaxy technique to fabricate the quantum dashes is MBE, although it will be understood that other epitaxy techniques may be used as well. In one embodiment, the self-assembled dashes are InAs islands that form on an AlGaInAs support layer grown on an (100) oriented InP substrate. The InP substrate is preferably cleaned in ultra-high vacuum prior to growth by heating the substrate to 520° C. under an $8 \times 10^{-6}$ $As_2$ millibar (mbar) beam equivalent pressure (BEP). In one embodiment, a quaternary support layer of AlGaInAs at least several tens of nm in thickness is then grown on the InP substrate. The growth temperature of the AlGaInAs is preferably in the range of 450° C. to 550° C. for optical devices. The $As_2$ BEP is preferably between $6 \times 10^{-6}$ to $1.5 \times 10^{-5}$ mbar. In one embodiment, the AlGaInAs layer is closely lattice matched to the InP substrate. In a preferred embodiment, the In and $As_2$ fluxes are selected to grow an equivalent thickness of 2 to 7 mono-layers of InAs.

The growth temperature is preferably selected to grow high quality InAs. In one embodiment, the growth temperature of the InAs is also within the temperature range of 450° C. to 550° C. For these growth conditions, elongated islands form on the AlGaInAs having a distribution of widths and lengths dependent upon the growth temperature, growth rate, and equivalent thickness. The height of the dashes varies between about 2 and 10 nanometers, depending on the equivalent thickness and growth temperature. The dashes are elongated along the <0$\bar{1}$1>crystal direction. A low coverage of InAs tends to increase the mean length of each dash. Additionally, an increased growth temperature tends to also result in a more uniform distribution of dot sizes. Conversely, an increase in growth rate tends to reduce the uniformity of the dash size.

Figure 4:
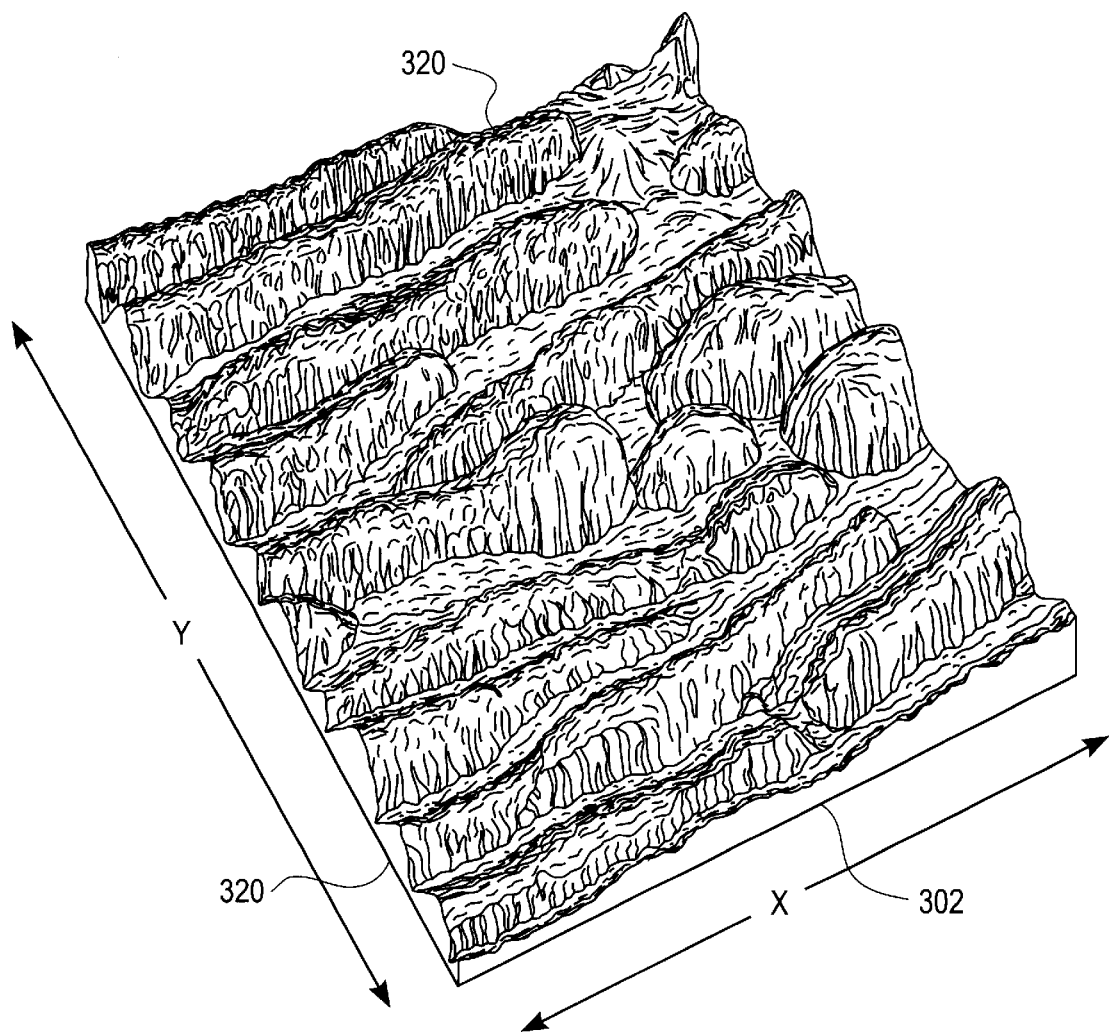
FIG. 4 is an atomic force microscopy image of self-assembled elongated InAs islands.

FIG. 4 shows an atomic force microscopy (AFM) image of uncapped InAs islands formed on AlGaInAs planar layers that are closely lattice matched to a (100) InP substrate. The test structure of FIG. 4 was grown using molecular beam epitaxy conditions similar to those described above. The scale of the image along the X and Y dimensions is 0.25 microns and 0.3 microns, respectively. Empirical measurements indicate a typical dash length of about 300 nanometers, a typical dash width of about 25 nanometers, and a typical dash height of 5 nanometers. However, it can be seen that the islands 320 have a statistical distribution in length, width, and height with respect to each other such that it is more appropriate to refer to a mean length, width, and height of the as-formed InAs islands. It can also be seen that there is a distribution in shapes, as well.

As previously described, the quantum dashes may be embedded in quantum wells. The composition of the quantum well layer may be selected to be lattice matched with respect to the substrate or strained up to the critical thickness for the generation of misfit dislocations. Referring to FIG. 4, it can be seen that the as-grown islands may have a significant variation in height. For quantum dashes embedded in quantum wells it is desirable that the islands be completely embedded in the quantum wells. There are several techniques that may be used to ensure that the dashes are completely embedded. Referring to the illustrative side view of FIG. 5, in one embodiment the quantum dashes 520 are embedded between an underlying quantum well layer 510 having a thickness of d1 and an upper quantum well layer 530 having a thickness of d2, with d2>d1. The quantum well layers are disposed between top and bottom barrier layers 508, 535, having a bandgap energy larger than that of the quantum well layers. Selecting the thickness of the upper quantum well layer to be thicker than the maximum InAs island height facilitates embedding all of the quantum dashes despite variances in the height of the quantum dashes. FIG. 6 is an illustrative side view of an embodiment in which growth parameters are adjusted to trim the quantum dashes. In this embodiment, InAs quantum dashes are grown and a top quantum well layer grown. The thickness of the top quantum well layer may be selected to be less than the height of the as-grown InAs islands. In this embodiment a thermal desorption (evaporation) step is performed after the growth of quantum well layer 530 to remove any uncovered portions of the InAs dashes (as indicated in phantom), thereby trimming the height of the dashes.

The quantum dashes may be included in the active regions of a variety of opto-electronic devices requiring optical gain, such as optical amplifiers and lasers. In particular, quantum dashes may be included in the active region of a p-i-n laser diode structure that includes an optical waveguide structure to provide optical confinement. The laser structure may comprise a bottom optical cladding layer grown having a first doping polarity; a first undoped waveguiding core layer; a quantum dash active region, a second undoped waveguiding core layer, and a top optical cladding layer of a second doping polarity.

Figure 7B:
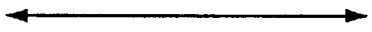
FIG. 7B is a second growth sequence for quantum dash lasers.

FIGS. 7A and 7B are illustrative diagrams growth sequences for quantum dash lasers. A n-type AlInAs optical cladding layer 705 is grown that is lattice matched to a n-type InP substrate 702. In one embodiment, a graded interface layer 704 is included to reduce electrical resistance. A first AlGaInAs waveguiding layer 710 having an energy bandgap corresponding to 1.03 eV is then grown. The AlGaInAs waveguiding layer preferably has a thickness of between about 100 nm to 500 nm. A first AlGaInAs quantum well barrier layer 715 is then grown having a composition corresponding to a bandgap energy of 1.03 eV. In one embodiment, the barrier layer is an $Al_{0.18}Ga_{0.32}In_{0.5}As$ layer having a thickness of about 15 nm. A first quantum well layer 720 is then grown. In one embodiment, the first quantum well layer comprises a 1.2 nm layer of $Al_{0.2}Ga_{0.15}In_{0.65}As$ having a semiconductor bandgap energy of 0.95 eV. A preselected nominal InAs layer thickness 725 is then grown having a sufficient number of mono-layers of InAs to form islands. In one embodiment, the nominal InAs layer thickness is 0.9 nm. Mean dimensions for the dashes are 300 nm, 25 nm, and 5 nm for the length, width, and height respectively, as measured by AFM for a growth temperature of 520° C. A second quantum well layer 730 is then grown to embed the islands. In one embodiment, the second quantum well layer is a 6.3 nm layer of $Al_{0.2}Ga_{0.15}In_{0.65}As$ having a semiconductor bandgap energy corresponding to a wavelength of 1.2 microns. A second barrier layer 735 is then grown. In one embodiment the second barrier layer is 15 nm of $Al_{0.18}Ga_{0.32}In_{0.5}As$. Multiple layers of embedded quantum dashes may be formed by repeating the growth sequence of layers 715, 720, 725, 730 735 for a desired number of cycles (e.g., one, three, five, or ten times). In one embodiment, the sequence of layers 715, 720, 725, 730, and 735 is repeated five times. A second waveguiding layer 740, such as an $Al_{0.2}Ga_{0.15}In_{0.65}As$ layer may then be grown. A p-type optical cladding layer 745 of $Al_{0.48}In_{0.52}As$ is then grown. A highly p-doped cap layer 750 may then be grown to facilitate forming high quality ohmic contacts to diode laser structure. A grading composition p-type layer 748 may be included to further reduce contact resistance.

The refractive indices of the optical cladding layers 705 and 745 and the waveguiding layers 710 and 740 are preferably selected to achieve a significant optical confinement in cavity lasers formed from the material. Empirical and theoretical techniques to select optical cladding and waveguiding compositions and thicknesses are well known in the art.

Generally speaking, the composition of the quantum well layers and/or the quantum well barriers may be selected to partially or totally compensate the strain of the quantum dashes, thereby reducing the tendency to form dislocations which might otherwise occur if multiple strained dash layers were grown. Note that the composition of the quantum well barrier layers in this example are selected to partially compensate for the strain of the quantum dashes and the quantum wells. In this embodiment, each quantum well is a compressively strained quantum well and the AlGaInAs barriers are tensile strained barriers. The quantum dash active region is preferably a pseudomorphically strained active layer.

The quantum dashes of the present invention have several characteristics that make them of interest for use in semiconductor lasers and optical amplifiers. First, the electrical confinement of electrons and holes is high, even at comparatively high injection levels. One reason for this is that the fill factor,(fraction of area occupied by dashes) of quantum dashes can be comparatively high (e.g., 20%) compared with conventional symmetric quantum dots due to the greater volume and higher packing efficiency of quantum dashes. The fill factor of quantum dashes is typically about twice that for quantum dots grown in comparable materials systems. A high fill factor tends to improve electron and hole capture when the quantum dashes are situated in the active regions of a semiconductor P-N laser diode junction since the high fill factor increases the statistical likelihood that electrons and holes injected into the active region enter and recombine in the dash layers.

Another feature that improves carrier confinement is forming each quantum dash within a quantum well having high electrical quality interfaces. In the embodiment of FIG. 7A, the cladding layers have a bandgap energy of about 1.27 eV. The inner waveguiding and barrier layers have a bandgap energy of about 1.03 eV. The quantum well layers have a nominal bandgap energy of about 0.95 eV. The InAs dashes have a nominal bulk bandgap of about 0.36 eV, although the strained quantum confined ground state energy is considerably higher. The quantum wells help to confine electrons and holes to the quantum dashes. While this provides a beneficial reduction in threshold current density of Fabry-Perot lasers designed to have a low threshold current, it also permits the quantum dashes to have acceptable current confinement when they are driven at high current levels (e.g., in lasers having a larger resonator loss). Moreover, the energy barriers of the quantum well help to prevent a loss of carriers at elevated operating temperatures that might otherwise occur due to thermionic emission of carriers out of the quantum dashes.

Figure 8:
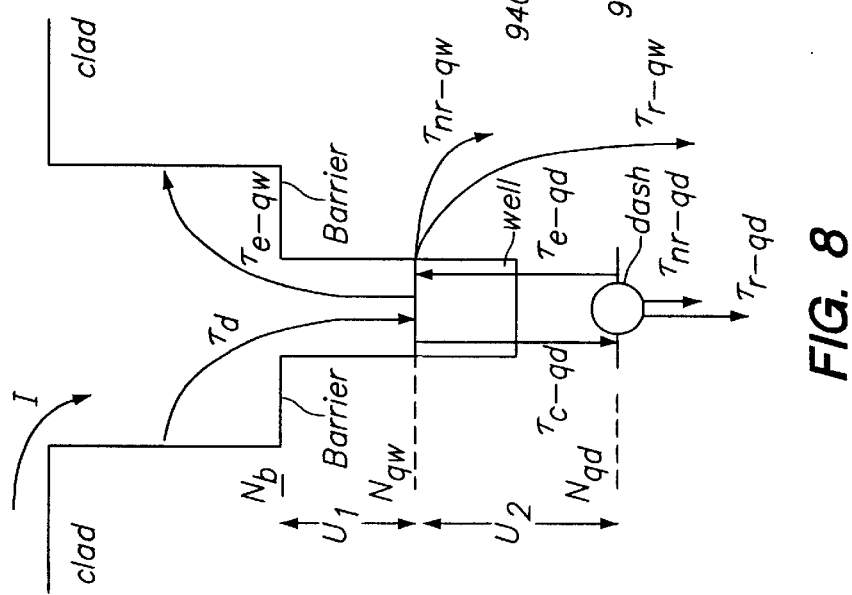
FIG. 8 shows an electronic conduction band of a quantum dash laser illustrating some of the considerations for designing lasers with quantum dashes embedded in quantum wells.

FIG. 8 is an illustrative diagram of the conduction band energy diagram across the layer structure of FIG. 7A perpendicular to the substrate showing equilibrium carrier concentration, where $N_b$ is the barrier carrier concentration, $N_{qw}$ is the quantum well carrier concentration, and $N_{qd}$ is the quantum dash carrier concentration. Electrons injected from the n-type cladding layer and holes injected from the p-type cladding layer enter the central waveguiding layer. There is a decay time, $\tau_d$ for carriers $N_b$ in the barrier/waveguide layers to decay into the quantum well carrier population $N_{qw}$. Conversely, there is thermionic emission of carriers out of the quantum well with a time constant $\tau_{e-qw}$. The quantum well carrier population is depleted by non-radiative recombination at the quantum well interfaces with a lifetime $\tau_{nr-qw}$. Additionally, there is radiative recombination of quantum well carriers with a lifetime $\tau_{r-qw}$. In equilibrium carriers may enter the dash from the quantum well with a time constant $\tau_{c-qd}$ and leave by thermionic emission with a time constant $\tau_{e-qd}$. Carriers are depleted from the quantum dashes by radiative recombination, with a time constant of $\tau_{r-qd}$ and non-radiative recombination with a time constant of $\tau_{nr-qd}$. Generally speaking if the quantum well growth is optimized, $\tau_{nr-qw}$ increases, i.e., comparatively little current is wasted on non-radiative interface combination in the quantum wells. Similarly, if the quality of the dash interfaces is optimized, comparatively little current is wasted on non-radiative recombination in the dashes. The thermionic emission of carriers out of the quantum well is reduced by selecting the quantum well parameters such that there is a significant energy difference $U_1$, between the quantum well energy barrier and the barrier energy level. Thermionic emission of carriers out of the quantum dashes (into the quantum wells) is reduced by selecting dash and quantum well barriers such that there is a significant difference $U_2$ in the energy levels of the quantum dash and the quantum well.

Figure 9:
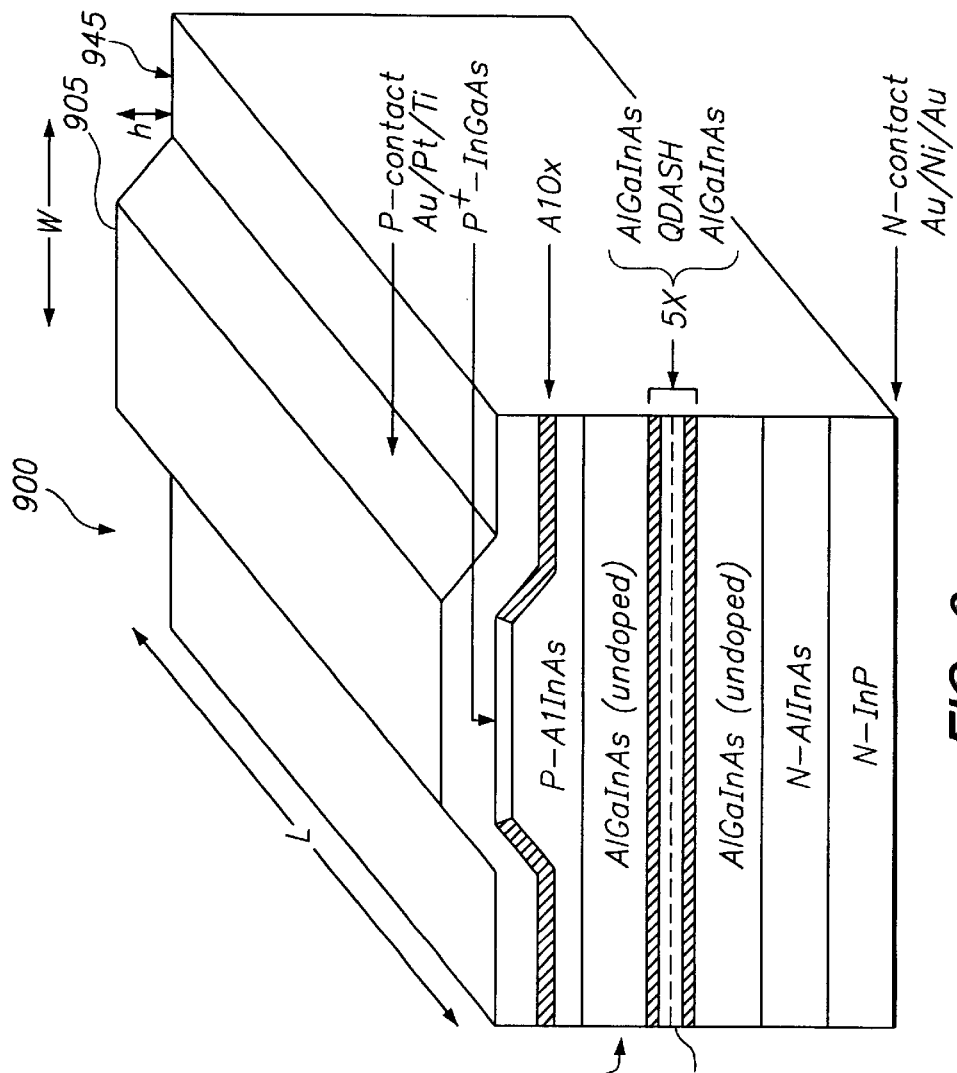
FIG. 9 is a perspective view of a ridge laser embodiment of a quantum dash laser.

One benefit of a quantum dash active region that makes them of interest for lasers is that a low threshold current density for lasing may be achieved. FIG. 9 is a perspective view of one embodiment of a ridge laser structure 900 fabricated from a materials structure similar to that shown in FIG. 7B. Ridge 905 has a width, W, and height, h, selected to form a lateral waveguide. In one embodiment the ridge 905 is formed by inductively coupled plasma (ICP) etching and wet oxidation of the upper p-$Al_{0.48}In_{0.52}As$ cladding layer. The dashes of the active region 910 are preferably oriented perpendicular to the long direction of the ridge. The ridge lasers are preferably $AlO_x$ patterned ridge laser structures. In one embodiment, the ridge lasers are fabricated as Fabry-Perot lasers having a longitudinal length, L, of an optical cavity formed by the ridge 905 with the reflectance from two facets 940 and 945 providing the optical feedback of the laser. Test lasers have a room temperature threshold current density as low as 350 A/cm$^2$. An optical amplifier may be formed form a similar ridge structure by suppressing the reflection from facets 940 and 945 (e.g., by anti-reflection coating the facets or using other conventional techniques to reduce the reflectance of light from the facets back into the laser cavity). While a ridge laser embodiment is shown in FIG. 9, it will be understood that a quantum dash active region may be employed in a variety of conventional Fabry-Perot laser structures and optical amplifier structures.

Another benefit of the quantum dash lasers of the present invention is that the quantum dash growth parameters may be selected to permit lasing at a wide range of potential lasing wavelengths at a comparatively low current density and a high optical gain due to the closer energy level spacing in an elongated dash. In particular, growth parameters may be selected that result in a broad and high optical gain spectrum. As is well-known, the optical gain spectrum for an opto-electronic device is the optical gain as a function of wavelength.

Figure 10:
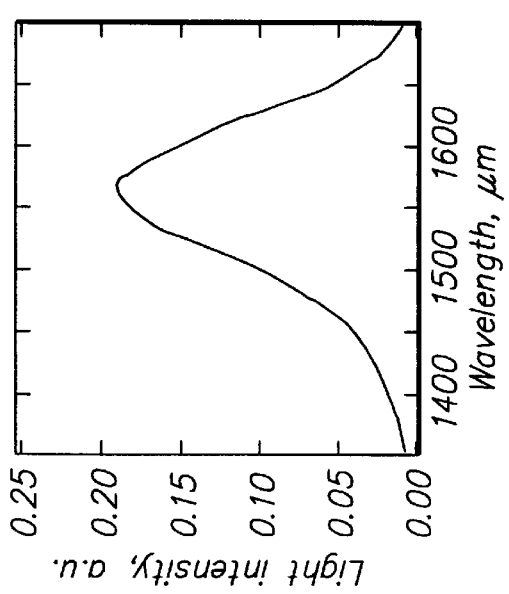
FIG. 10 is a plot of room temperature photoluminescence results for an exemplary quantum dash laser.

FIG. 10 shows room temperature photoluminescence of InAs quantum dash material for a structure similar to that of FIG. 7A. The full width of half maximum (FWHM) is typically greater than 30 meV. The breadth is attributed, in part, to inhomogenous broadening of the optical gain due to statistical variations in the length, width, and height of each quantum dash which result in a variance in the quantum confined energy levels of each dash.

Figure 11B:
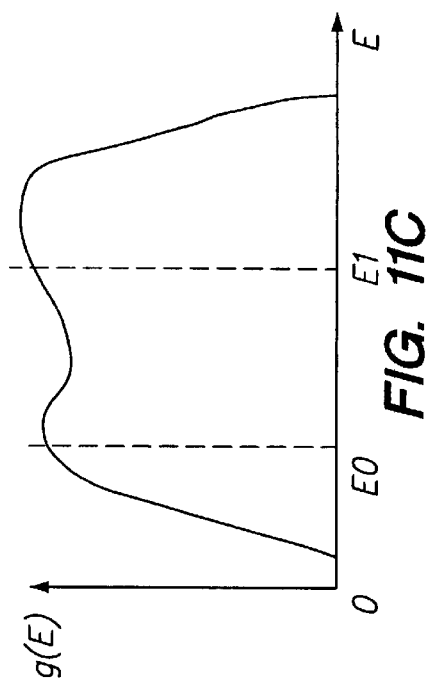
FIGS. 11A, 11B, and 11C are diagrams illustrating some of the factors that permit quantum dash lasers to provide gain over an extended wavelength range.
Figure 11C:
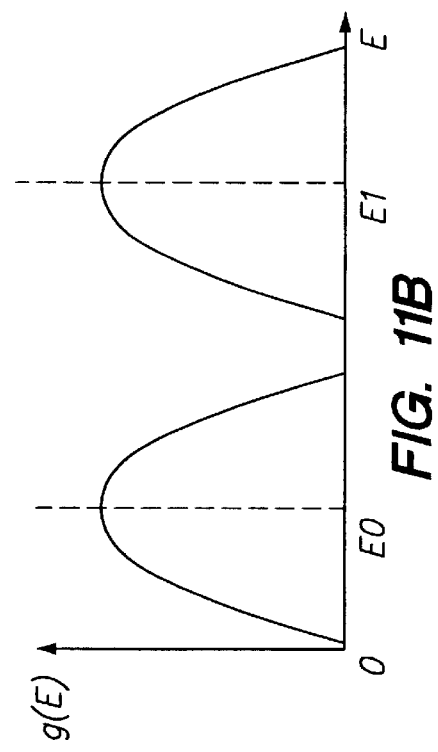
Figure 11A:
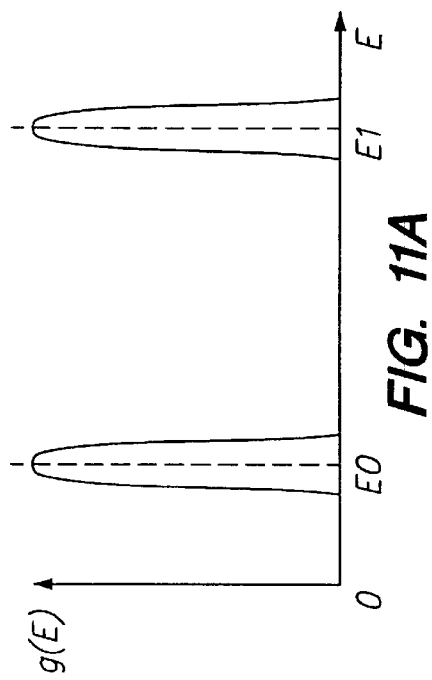
Figure 12A:
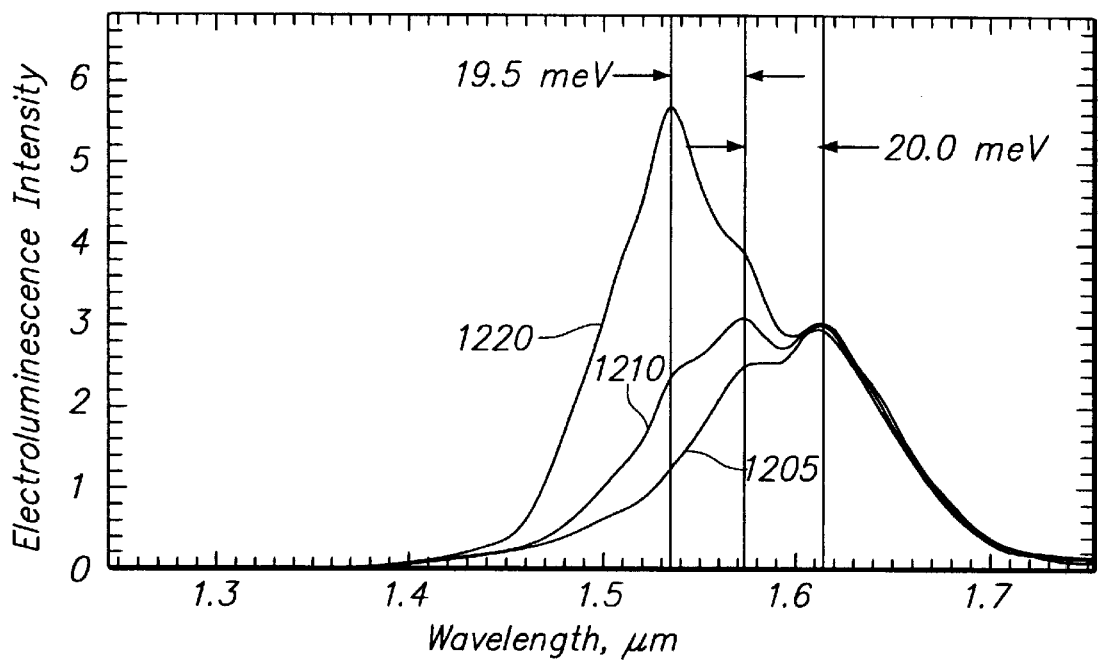
Figure 12B:
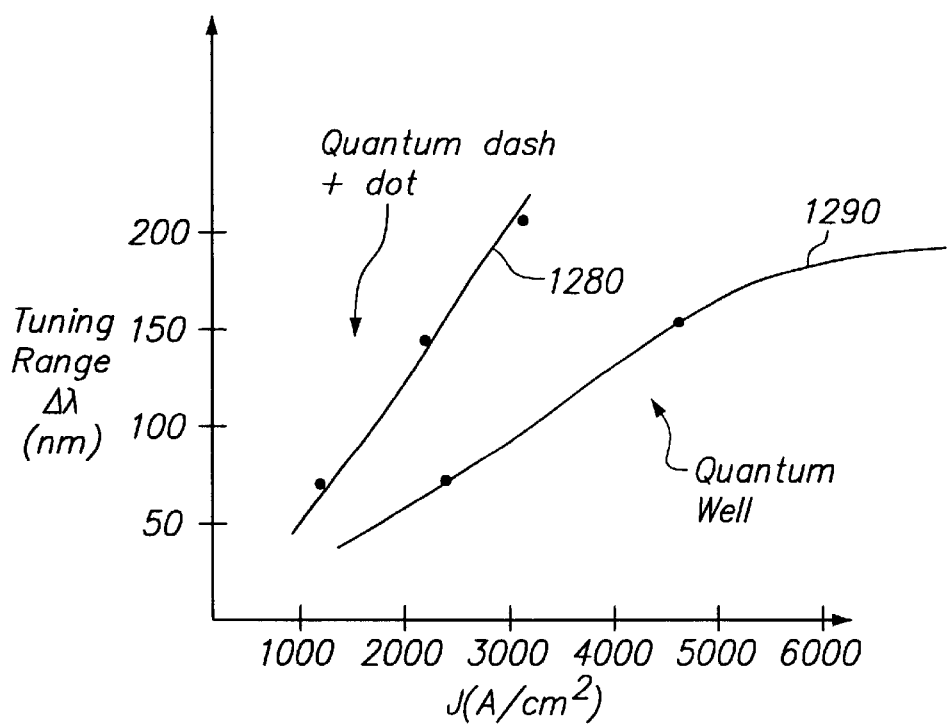

FIGS. 11A, 11B, and 11C are illustrative diagrams of optical gain versus energy that illustrate how quantum dash parameters may be selected to achieve a broad, high optical gain spectrum. As shown in FIG. 11A, an ensemble of uniformly sized quantum dashes that functioned as ideal quantum dots would have an atomic-like density of states and optical gain. The dashed lines about a ground state energy, E0 and a second peak at a first excited state E1 are for ideal quantum dots. For ideal quantum dots, the optical gain saturates above a certain pumping level (since all of the available finite number of states in the delta-function density of states are populated). The inventors have discovered that there is significant homogenous broadening of the optical gain spectrum of quantum dot lasers, as indicated by the curved response about E0 and E1. The homogenous broadening may be attributed, for example, to collisions of electrons with phonons and other electrons FIG. 12B illustrates the effects of inhomogenous broadening associated with a variation in dash size. Since the dashes are not quantum mechanically coupled to each other (i.e., each dot behaves as if it is an independent lasing media within the same cavity) the variation in dash size results in a distribution of the ground state and excited state energies of the dashes, further broadening the gain function. If the homogenous broadening is comparable to the inhomogenous broadening a continuous and smoothly varying gain response will result. As indicated by FIG. 11B, the interplay of homogenous and inhomogenous broadening may more than double the width of the gain response. A lasing-mode photon will receive gain from not only the energetically resonant dashes but also from other non-resonant dashes that lie within the range of homogenous broadening. As indicated in FIG. 12C, if the separation between the ground state and the excited states of the quantum dashes is also appropriately selected, a continuous gain response can be achieved over an extended wavelength range (with increased gain at higher energy due to the increased degeneracy of the higher order states). However, since each dash still retains a delta function density of states, the gain response still has a ground state saturation characteristic similar to ideal quantum dots.

The inhomogenous broadening and separation between energy levels of the quantum-confined states can be substantially controlled by appropriate selection of quantum dash growth parameters. The quantum confined energy levels of a dash are determined by its composition, the composition of barrier layers, and by the height, length, and width of the quantum dash. Variance in the height, length, and width, of each quantum dash increases the inhomogenous broadening. Additionally, the energy spacing between the ground state and excited states of the quantum dash can be controlled by selecting the height, length, and width of the dash. A quantum dash can be modeled as an elongated quantum box having a height, a width, and a length. As is well known, to a first order approximation, the first confined quantum states along each dimension of an ideal quantum box have energy levels that vary inversely with the square of the length, i.e. the energy levels, $E_{n_1,n_2,n_3}$, of an ideal quantum box with infinite barriers having a length Lx, a width Ly, and a height Lz is: $E_{n_1,n_2,n_3} = \Delta E_0(n_1^2/Lx^2 + n_2^2/Ly^2 + n_3^2/Lz^2)$, where $n_1$, $n_2$, and $n_3$ each integers equal to or greater than 1 and $\Delta E_0$ is a material constant. For a quantum box with finite energy barriers, the separation in energy between quantum states tends to vary more slowly due to the penetration of the quantum mechanical wave function into the barrier layers. The elongated quantum dots of the present invention may be grown with a variety of length-to-width-to-height ratios by, for example, adjusting the InAs monolayer coverage, growth rate, and growth temperature. This permits substantial control over the available quantum states for lasing while still retaining a high fill factor.

The sequence of steps in energy of the quantum confined states of the quantum dashes may be selected to facilitate forming a broad, high optical gain spectrum. (It will be understood that the quantum confined states of electrons and holes each have quantum confined energy levels but that there is also an optical transition energy associated with electron-hole recombination, with the optical transition energy associated with the quantum confined states being measurable from the light generated by the quantum dashes. There is thus a ground state optical transition energy associated with the ground state, a first excited state optical transition state energy associated with the first excited state, etc.). In particular, in one embodiment the mean size of the dashes is selected to beneficially increase the number of available quantum confined states for lasing by reducing the energy separation between the ground state and the first excited state to achieve a difference in optical transition energy of less than about 30 meV, with 20 meV being a preferred energy separation. For an active region with a ground state wavelength of about 1.5 to 1.6 microns, this corresponds to the optical transition associated with the first excited state being about 40 nm to 60 nm longer in wavelength than the optical transition associated with ground state. Similarly, the value of the optical transition energy associated with the second excited state is also preferably within about 20 meV to 30meV of the value of the optical transition energy associated with the first excited state. By way of comparison, experiments by the inventors indicate that it is difficult to achieve a similar sequence of energy values with an acceptable fill factor in quantum dots that are not elongated since the separation in energy values is typically greater than 30 meV. (See e.g., the paper by Li et al., "150-nm Tuning Range in Grating-Coupled External Cavity Quantum-Dot Laser," IEEE Photonics Technology Letters, Vol. 12, No. 7, July 2000, which reports quantum dots having a ground state transition energy value at 1.24 microns and a first excited state transition energy value at 1.15 microns).

In one embodiment, the energy difference of successive quantum confined states of the quantum dashes is selected to facilitate forming a broad, high optical gain spectrum. FIG. 12A is a plot of the electroluminescence (EL) intensity of a quantum dash light emitting diode (LED) at several different current densities. The LED is a ridge waveguide having a nominal width of 5 microns and a cavity length of 1.4 millimeters. As indicated by plot 1205 a comparatively low current density of 0.7 kA/cm$^2$, the optical intensity has a first peak at a wavelength of about 1.61 microns, with the first peak being attributed to an optical transition energy of the ground state. The optical intensity is fairly broad, e.g., has a FWHM of about 100 nm that is attributed to inhomogenous broadening associated with the variation in quantum dash size, the multiple closely spaced energy levels, and to homogenous broadening. The comparatively smoothness of the light output indicates that inhomogenous broadening and homogeneous broadening effects are likely to be comparable in degree. As indicated in plot 1210, at a first higher current density of 1.43 kA/cm$^2$ a second peak in the light intensity occurs at a shorter wavelength of about 1.57 microns, corresponding to about a 20 meV shift. The peak at the second optical transition energy is attributed to the additional optical gain associated with a first excited state of the quantum dash. As shown in plot 1220, at a still higher excitation level of 2.85 kA/cm$^2$, a third peak appears at a still shorter wavelength of about 1.53 microns that is attributed to the next excited state, which has an optical transition energy level that is also approximately 20 meV higher in energy than the second peak.

Figure 13:
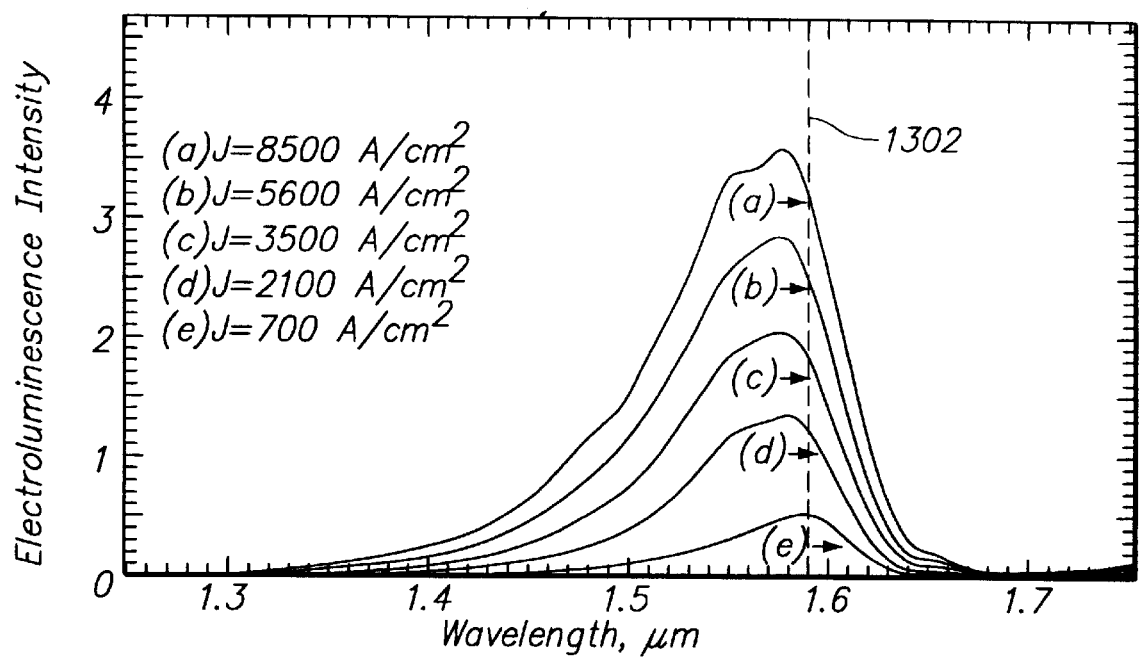
FIG. 13 shows experimental plots of electroluminescence intensity as a function of wavelength for a LED with a conventional quantum well active region operated at several different current densities.

A desirable feature illustrated in the plot of FIG. 12A is that the intensity (and hence the optical gain) saturates for the ground state once a certain current density is exceeded due to the nature of the delta-function density of states associated with the quantum dashes. This is in contrast to conventional quantum wells, in which the ground state does not saturate. FIG. 13 is a plot of electroluminescence intensity versus wavelength for a long wavelength quantum well LED. The LED is fabricated from an layer having an active region with three quantum wells and having a similar ridge dimensions to the structure of FIG. 12. The electroluminescence intensity (and hence the optical gain) increases for all wavelengths between 1.4 to 1.65 microns as the current density is increased from 0.7 kA/cm² to 8.5 kA/cm². With reference to dashed line 1302, it can be seen that the gain curve increases in height and shifts to higher energy without saturation.

Figure 14A:
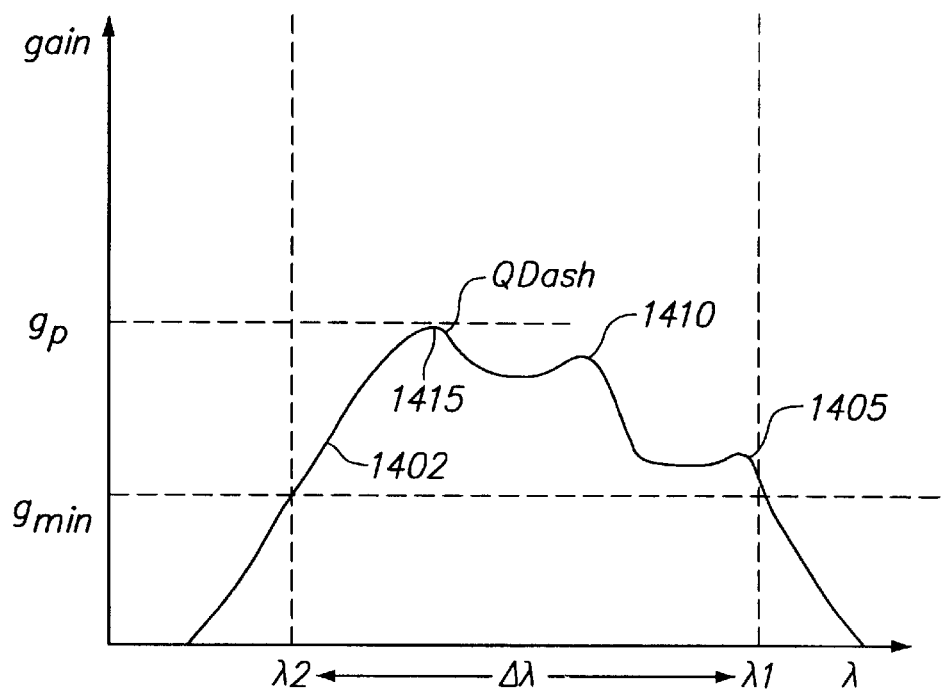
FIG. 14A is a first plot illustrating a method of designing a quantum dash laser for operation over an extended wavelength range.

A semiconductor laser including a quantum dash active region may be designed to operate over a wide range of wavelengths at a comparatively low current. FIG. 14A is an illustrative plot 1410 of cavity optical gain ($e^{2gL}$ where g is the gain per unit length and L is the length of the gain medium in the cavity) of a laser quantum dash active region at a selected current. Referring to FIG. 14A, a quantum dash active region may be designed to have a ground state quantum level corresponding to a peak 1405 at a wavelength $\lambda_1$. In the illustrative diagram the current is selected such that the gain at $\lambda_1$ is saturated with a saturated value greater than $g_{min}$, a minimum gain, to overcome a resonator loss that includes a mirror loss and an absorption loss. If an extended tuning range is desired, the first excited quantum states (e.g., first excited state 1410 and second excited state 1415) associated with quantum confinement along the length and width of the dashes may be designed to provide additional higher energy states, as indicated by the peaks 1410 and 1415 between $\lambda_1$ and $\lambda_2$. Plot 1440 illustrates a gain response for a conventional quantum well laser. By way of contrast, a conventional quantum well active region providing gain over a comparable wavelength would not have a saturable gain at the first ground state of the quantum well, necessitating an extremely high current density to achieve the minimum gain over the entire wavelength range. Rough estimates by the inventors indicate that a quantum dash laser can achieve a wide tuning range with approximately ten times less current than a comparable quantum well laser. For example, a 240 nanometer tuning range has been achieved in a tunable quantum well laser operated at drive current of 33 kA/cm2. See, e.g., H. Tabucho and H. Ishikawa, "External grating tunable MQW laser in an external cavity across the entire 1.3 μm communication window," *Electron. Lett.*, vol. 27, pp. 95–91, 1991. Referring again to FIG. 13, the electroluminescence spectrum of quantum dash lasers in accordance with the present invention indicate that a tuning range of greater than 240 nanometers is possible with a current density less than about 3.3 kA/cm².

FIG. 12B is an illustrative plot of tuning range versus current density for a nominal 1.5 micron wavelength laser tuned to shorter wavelengths. The quantum dot/dash plot 1280 is based upon experimental data of the inventors. The quantum well plot 1290 is based upon various numbers published in the literature. Referring to plot 1280, quantum dot lasers permit about 70 nm of tuning per each 1 kA/cm² increase in pump current density. By way of contrast a conventional quantum well requires about 2.3 kA/cm² to achieve a 70 nm tuning range. It can be seen in plot 1290 that the quantum well has an abrupt increase in threshold current range when the tuning range exceeds 10% of the nominal wavelength (150 nm for this case). Above a 10% tuning range, the bias current increases dramatically, typically exceeding 10 kA/cm². However, for a long lifetime operation, quantum well lasers used in tunable lasers are commonly operated with a maximum current density corresponding to about a 70 nm tuning range. As can be seen in plot 1280 a quantum dot active region of the present invention may be tuned to greater than 150 nm (e.g., greater than 200 nm) with current densities in the 2–3 kA/cm² range. This permits, for example, a single quantum dash laser to be used to achieve a tuning range of 180 nanometers at a current density of less than about 3 kA/cm² which is impractical with conventional quantum well lasers.

For a particular application, the total saturated gain of the ground state available may be adjusted using several different techniques. First, if more gain is required the number of layers of quantum dashes can be increased in the active region, which increases the number of quantum dashes that an optical mode interacts with as it traverses the active region. Second, the length of the active region can be increased to further increase the total gain. The optical gain response can be adjusted by empirically varying growth parameters that produce inhomogeneous broadening (i.e., the size distribution of the dashes).

Figure 14B:
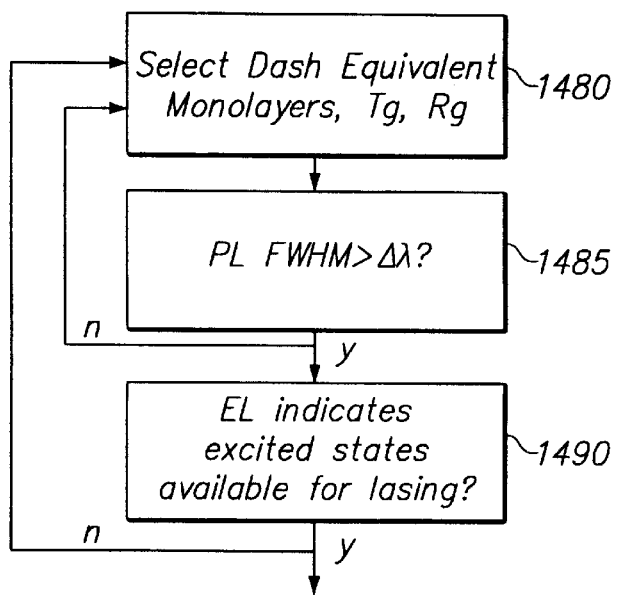
FIG. 14B is a second plot illustrating a method of identifying growth parameters for quantum dash lasers to be operated over an extended wavelength range.

An iterative technique may be used to select growth parameters as illustrated in the flow chart of FIG. 14B. For example, an initial selection of growth parameters may be selected 1480, including the equivalent monolayer thickness of the quantum dash layer, the growth temperature, Tg, the growth rate, Rg, and the thickness of the covering or embedding layer. Photoluminesence (PL) of test structures may then be performed. The PL is assessed 1485 to determine if the PL of the sample is centered around the desired wavelength and has a high intensity and FWHM greater than a preselected FWHM indicative of a desired level of inhomogenous broadening. Examples of criteria that may be used include: selecting the FWHM to correspond to a greater than a minimum energy spread (e.g., greater than a 30 meV spread in energy) or selecting the FWHM to be greater than about a preselected percentage of the center wavelength (e.g., greater than 1% of the center wavelength).

If the sample does not satisfy the criteria, other growth parameters may be selected. If desired, light emitting diodes may be fabricated and EL measurements performed 1490 to determine if the excited quantum states of the quantum dashes beneficially contribute to broadening the gain response. If necessary, empirical growth parameters may be varied to adjust the spacing between the ground quantum state and excited states of the quantum dashes to beneficially broaden the gain response. For example, if a 20 to 30 meV separation between quantum states is desired, electroluminescence of test samples may be used to select growth parameters for which the excited states of the quantum dashes are spaced 20 to 30 meV above the ground state.

Figure 15:
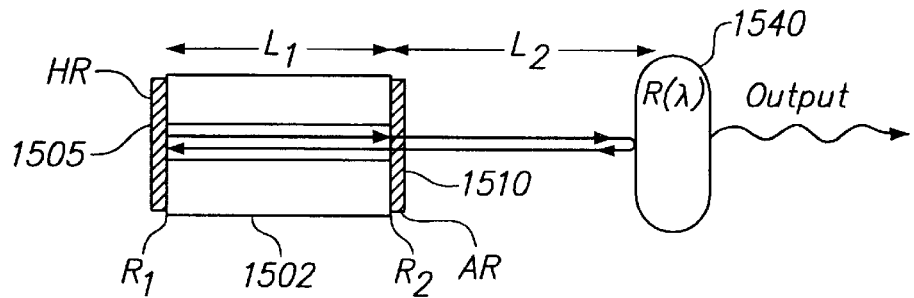
FIG. 15 illustrates a generic external cavity laser for selecting the lasing wavelength of a quantum dash laser.

A quantum dash laser of the present invention may be used as the active gain medium of a tunable external cavity laser. FIG. 15 is a top view of a generic external cavity laser. The threshold condition for lasing is that the summation of the resonator losses (mirror and internal losses) is balanced by the optical gain of the gain medium. In a tunable laser, a wavelength selector 1540 is included that has a reflectivity that is a function of wavelength. Typically a rear facet 1505 of a laser diode 1502 retains a high reflectivity whereas a front facet 1510 is processed to have an extremely low reflectivity. The threshold condition for the external cavity system is:

$$R_1 e^{2(g-\alpha i)L_1} R(\lambda) e^{(-2\alpha e L_2)} = 1,$$

where R1 is the reflectivity of the rear facet of the laser diode, g is the gain per unit length of the laser diode, αi is the loss per unit length of the laser diode, L1 the cavity length of the laser diode, R(λ) the reflectivity of the wavelength selector, αe is the average loss per unit length of the external cavity, and L2 is the effective length of the external cavity.

Figure 16A:
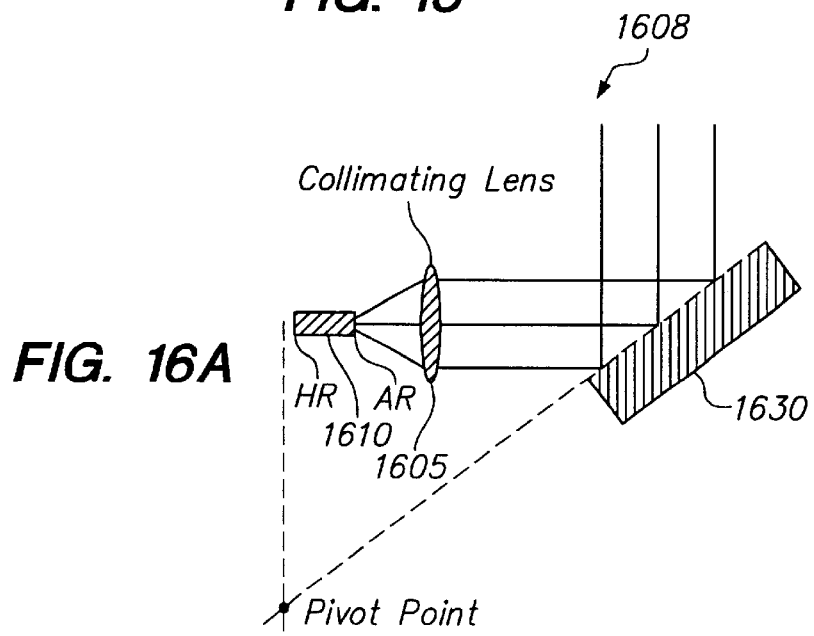
FIGS. 16A and 16B illustrate examples of external cavity laser configurations that may be used to tune the wavelength of a quantum dash laser.
Figure 16B:
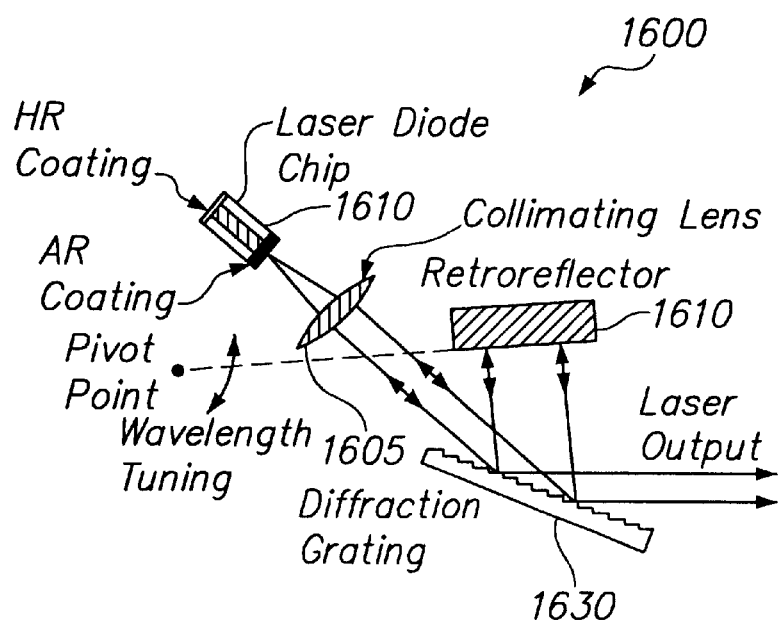

In an external cavity tunable laser, the wavelength selector may be any combination of external elements whose transmittivity or reflectivity response as a function of wavelength may be controlled such as to limit the optical feedback to the laser to a narrow wavelength band. Tunable external cavity lasers typically use an external grating arranged to provide wavelength-selective optical feedback based on wavelength-selective dispersion. Referring to FIGS. 16A and 16B, in an external cavity semiconductor laser typically one facet of a laser diode is coated with a high reflectivity (HR) material and the other facet is coated with an antireflection (AR) coating. An external grating is typically arranged to provide wavelength selective feedback back to the laser diode and to also serve as an output coupler. The reflectivity of the AR coating and the length of the laser cavity are preferably selected to suppress Fabry-Perot (FP) modes in the laser. It will also be understood that any known technique to suppress Fabry-Perot modes from the cleaved facets over a range of wavelength may also be used, such as incorporating unguided window regions or tilting the laser stripe with respect to the facet during device fabrication. The length of the semiconductor laser and residual reflectivity of the AR coated facet is preferably selected such that the external grating solely determines the lasing wavelength. In one embodiment, the length of the semiconductor laser and the residual reflectivity of the AR coated facet is selected so that the laser is incapable of lasing off the ground state and at least the first excited state of the quantum dashes without feedback from the external grating.

In an external cavity laser, the minimum gain must exceed the cavity losses. Thus, referring back to FIG. 15, to achieve a wide tuning range the saturated laser gain for the ground state should be selected to be greater than the total resonator losses, which include the absorption losses and mirror losses. However, the grating selected wavelength only depletes the optical gain within the homogenous gain broadening range such that the grating selected wavelength only suppress the FP mode only within approximately 20 nm of the free-run emission wavelength. Consequently, in one embodiment, the peak gain at high quantum states, $g_p$, is preferably selected to be sufficiently low to prevent deleterious lasing from FP modes due to residual facet reflectivity of the front facet.

Two common external cavity configuration are the Littman-Metcalf external cavity and the Littrow external cavity. FIG. 16B is an illustration of a Littman-Metcalf laser cavity. FIG. 16A is an illustration of a Littrow laser cavity 1608. In the Littrow cavity the angle of incidence of the light received by the grating 1630 from the laser 1610 is such that the beam is reflected back to the laser serving the function of one mirror of the laser cavity. The angle of the grating determines the wavelength. An etalon is sometimes included in a Littrow configuration to decrease the cavity bandwidth. In the Littman-Metcalf configuration 1600, the grating 1630 diffracts the light towards a tuning mirror 1610 (also known as a retroreflector), which determines the feedback. Collimating lenses 1605 are typically included in an external cavity laser to improve the coupling of the laser output to the grating.

One application of a tunable laser in accord with the present invention is for testing & monitoring (T&M) applications. A practical tunable laser for T&M applications must have a maximum operating current selected to achieve a reasonable laser lifetime (e.g., a current density of greater than 10 kA/cm$^2$ is typically correlated with a degraded lifetime). In commercially available tunable lasers using quantum well gain medium the quantum well lasers have useful wavelength range of about 70 nanometers. However, in many applications it is desirable to have a larger tuning range. For example, in some fiber optic applications it is desirable to be able to continuously tune across the S$_+$ band (1450–1490 nm), S band (1490 nm–1530 nm), C band (1530–1570nm), L band (1570–1610 nm), and L$^+$ band (1610–1650 nm). Conventionally, three tunable lasers, each having quantum well gain media optimized for different wavelength ranges, would be required for T & M over a 200 nanometer tuning range. By way of contrast, the quantum dash lasers of the present invention have a continuous tuning range of at least 200 nanometers at practical current densities.

Figure 17:
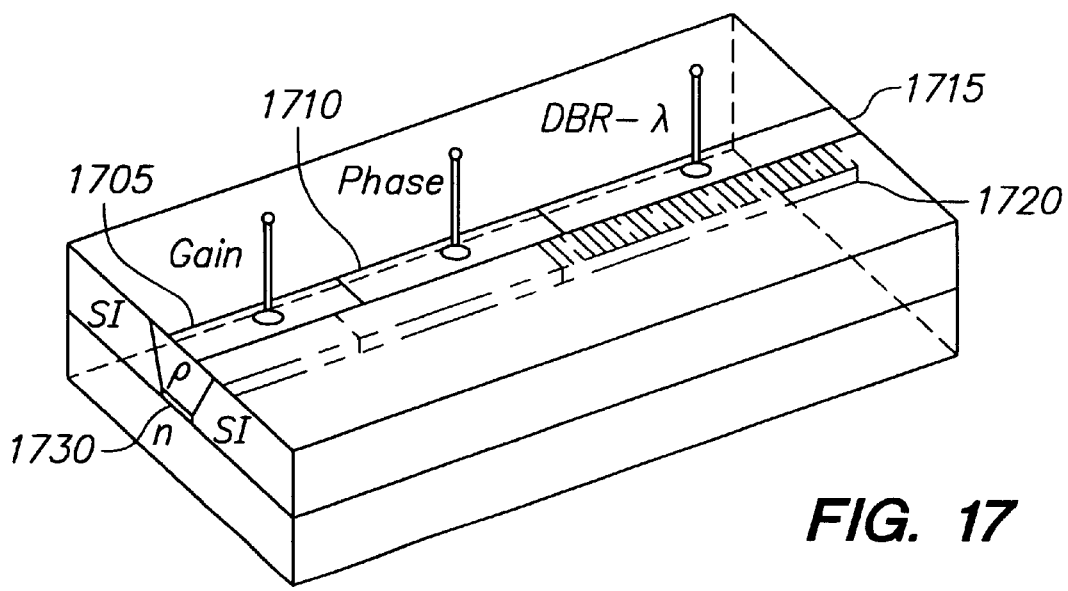
FIG. 17 is a perspective view illustrating a multi-section DFB/DBR laser with a quantum dash active layer.

It will be also be understood that the quantum dash active regions of the present invention may be used in laser structures having an integrated wavelength selector element to tune the lasing wavelength. A variety of other semiconductor laser structure with wavelength selector elements are known in the art. In particular, a variety of tunable distributed Bragg reflector (DBR) and distributed feedback laser structures (DFB) are known in the lasing art. DFB and DBR lasers include a grating that define a Bragg wavelength condition given by $\lambda m=2n\Lambda/m$, where $\Lambda$ is the grating period, n is the refractive index of the material, and m is the diffraction order. The Bragg wavelength condition defines a wavelength having a high effective reflectivity associated with the grating. As shown in FIG. 17, multi-section DFB and DBR lasers are known in the art having a plurality of sections 1705, 1710, 1715 in which a current may be adjusted in one section of the laser to adjust the refractive index of a portion of the grating 1720 of the laser and hence its Bragg wavelength. A conventional tunable DFB or DBR laser may be modified to include a quantum dash active region 1730 of the present invention.

Figure 18A:
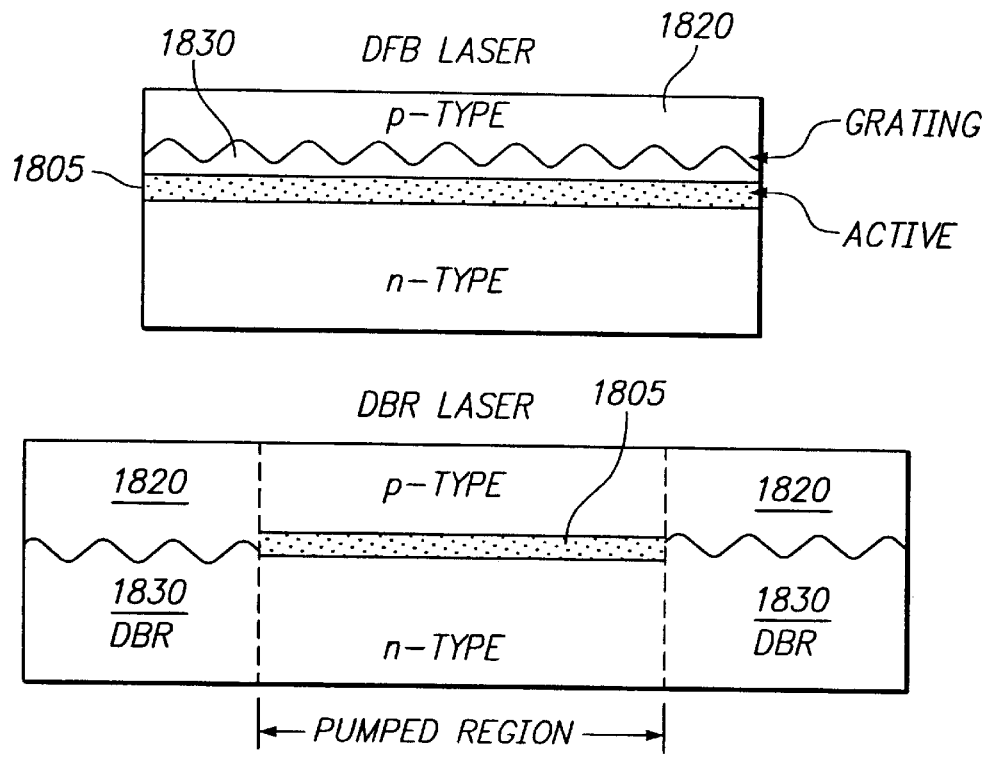
FIG. 18A illustrates some of the layers of a DFB quantum dash laser.
Figure 18B:
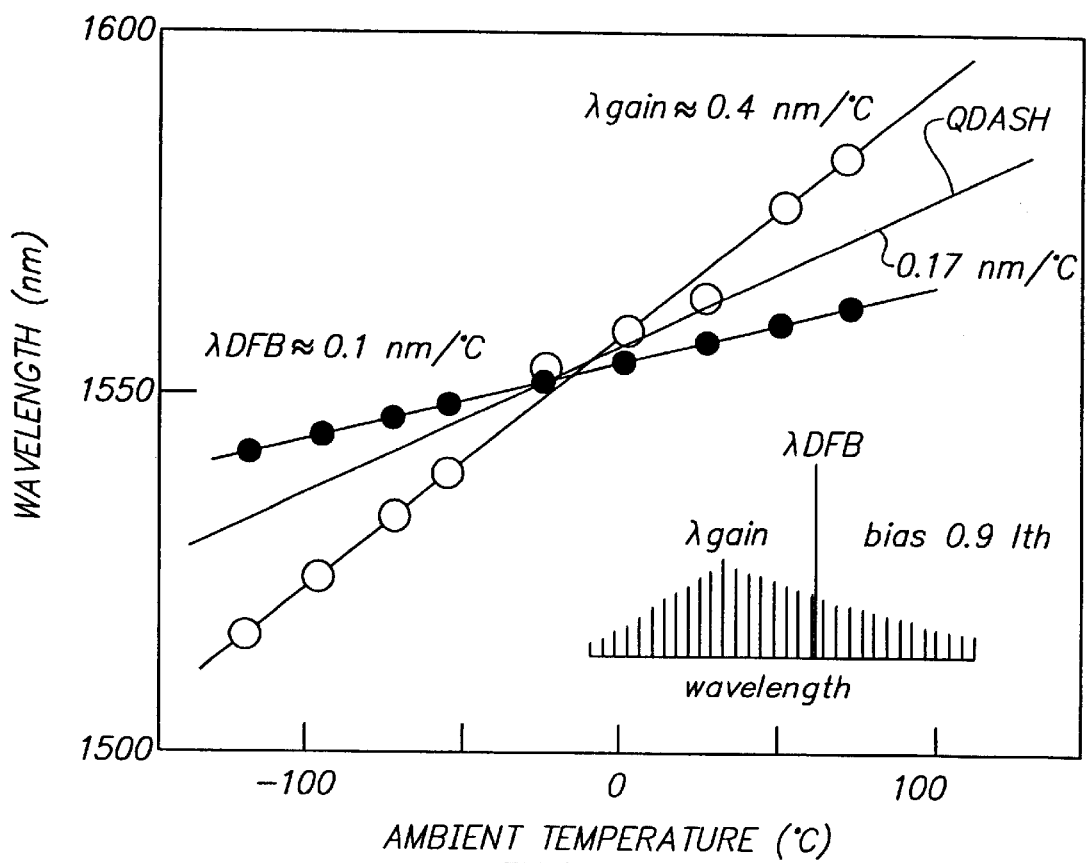
FIG. 18B are plots of the wavelength tuning of the gain peak and Bragg wavelength for conventional lasers and quantum dash lasers.

Additionally, the output wavelength of a semiconductor laser having a quantum dash active region may be temperature tuned. Referring to FIG. 18A, a distributed feedback laser having a quantum dash active region 1805 may include any conventional grating structure to establish a Bragg lasing condition from the periodicity of a grating fabricated on waveguide layers 1820, 1830 having different refractive indices. In a conventional DFB laser, thermal expansion and the temperature dependence of the refractive index causes a shift in the Bragg wavelength of about 0.1 nm/° C. In conventional 1.5 micron lasers the gain peak shifts by about 0.4° C. The result is that there is a limited temperature range (e.g., typically about 40° C.) over which the DFB laser retains good modal properties, i.e., the DFB laser tends to have too high a threshold current or has poor mode discrimination if the temperature rises such that the gain peak is substantially longer in wavelength than the Bragg wavelength. FIG. 18B shows the shift in Bragg wavelength and gain peak versus temperature for conventional 1.5 micron lasers. Quantum dash active regions are expected to have the same gain shift behavior as other types of quantum dots due to the delta function density of states associated with the three dimensional quantum confinement of the quantum dashes. Experiments by the inventors indicated that quantum dots have a measured shift in peak gain of only about 0.17 nm/° C. due to the delta-function density of states associated with the three dimensional quantum confinement. The reduced temperature sensitivity of the gain peak along with the broad gain function permits a temperature tuned DFB quantum dash laser to achieve an increased tuning range compared to a conventional bulk or quantum well DFB laser. In one embodiment of a DFB laser, the Bragg wavelength is selected to operate on the long wavelength side of the optical gain spectrum at a first operating temperature to facilitate operating the laser at higher operating temperatures (which shifts the optical gain spectrum to longer wavelengths).

The quantum dash active region of the present invention may also be used in monolithic multi-wavelength arrays of lasers. FIG. 19A is a perspective view of a multi-wavelength array 1900 of lasers 1920. Each laser 1920 may be fabricated as a ridge laser, buried heterostructure laser, or other laser structure providing lateral optical confinement. Each laser has a longitudinal cavity length, L. A conventional cleaving or etching process may be used to form a laser facet 1915. The array 1900 is formed on a common substrate 1905 having a quantum dash active region 1910. The growth parameters of the quantum dash active region 1910 are selected to achieve a desired wavelength tuning range (e.g., 100 to 200 nm) within a desired range of current densities. Each laser is preferably a DFB or DBR laser having at least one grating section 1930 with the grating periodicity, Λ, of its grating selected to achieve a desired wavelength of the laser. One benefit of the monolithic multi-wavelength array 1900 is that the large tuning range of the quantum dash active region 1910 permits DFB or DBR lasers 1920 having a large number of different output wavelengths to be simultaneously fabricated for dense wavelength division multiplexed (DWDM) applications. Alternately, array 1900 may be used for wide wavelength division multiplexed (WWDM) applications in which it is desirable to have a smaller number of wavelengths but with a significant wavelength spacing.

The optical characteristics of the quantum dash active region 1910 of array 1900 also permits each laser to be directly modulated at high data rates. Theoretical investigations by the inventors indicate that optimized quantum dash lasers should have a linewidth enhancement factor that is approximately a factor of five-to-ten lower than for conventional quantum well lasers along with a higher differential gain. This makes it practical to directly modulate quantum dash lasers at high data rates (e.g., 10–40 Gbit/s) with acceptable chirp. This is in contrast to conventional quantum well lasers, which are typically modulated with external modulator at high data rates to reduce chirping effects. Additionally, the low threshold current density of the quantum dash lasers of the present invention facilitate direct laser modulation. Typically, directly modulated high-frequency lasers require drive currents that are several times the threshold current. The comparatively low threshold current of each laser of multi-wavelength array 1900 facilitates direct modulation at high data rates. Consequently, in one embodiment, each laser of the multi-wavelength array is directly modulated by varying its drive current. This eliminates the needs for external modulators, filters, and optical isolators used in conventional DWDM systems. As shown in FIG. 19B, if each laser of the array is directly modulated their outputs may be directly received by an optical combiner (MUX) 1950 module and coupled to an optical fiber. It will be understood that in a direct current modulation embodiment that any conventional high frequency packaging technique may be used to facilitate coupling microwave frequency drive currents to each laser. In one embodiment, each laser is driven by a wire bond. However, a wire bond has a parasitic inductance such that long lengths of bonding wire may degrade performance at very high data rates. In another embodiment, microwave transmission lines are fabricated on array 1900 to facilitate coupling microwave drive current to each laser. In still another embodiment, array 1900 is mounted on a submount adapted to provide microwave current to each laser.

One benefit of a multi-wavelength array 1900 of the present invention is that temperature tuning may be used to fine-tune the wavelength of a large number of wavelengths. Referring to FIG. 19C, in one embodiment, the nominal DFB wavelengths at a first temperature, $T_1$, are selected to cover an upper wavelength range of the gain spectrum. Tuning the temperature of array 1900 to a higher temperature $T_2$ shifts the gain spectrum at a slightly higher rate than the Bragg wavelengths. Due to the large initial width of the gain curve and the reduced temperature shift of the gain response of quantum dash lasers, a monolithic array of DFB lasers spanning a large wavelength range can be simultaneously tuned over a wide range.

Another benefit of array 1900 is that the low threshold current density and slow drift of the gain response with temperature renders the lasers less susceptible to heating and thermal cross-talk. This may permit, for example, individual lasers to be more closely packed (e.g., a small inter-laser separation) compared with conventional quantum well lasers. Additionally, the thermal characteristics of array 1900 may facilitate operating the array junction up, i.e., with the substrate mounted to a heat sink. As is well known in the laser art, a junction down configuration (epitaxial layer mounted to the heat sink) has less thermal resistance but typically increased the packaging complexity and cost. Still another benefit of array 1900 is that for some applications, such as WWDM, the need for the heat sink to be cooled may be eliminated.

In one embodiment, a quantum dash active region is included in a vertical cavity surface emitting laser (VCSEL) structure, as shown in FIG. 20. Any conventional VCSEL laser mirror and cavity structure may be used. In a VCSEL laser structure is it desirable to increase the dash density and include a sufficient number of dash layers to increase the modal gain. Conventional DBR layers may be used for top and bottom mirrors of the VCSEL. Moreover, the VCSEL may be any known tunable VCSEL. Tunable VCSEL structures include VCSELs having a variable effective cavity length, such as microelectormechanical (MEM) element, such as a cantilevered micro-mirror supported by a deformable membrane.

While the use of quantum dash active regions in semiconductor lasers has been described in detail, it will be understood that quantum dash active regions may also be used in semiconductor optical amplifiers (SOAs). SOAs are commonly manufactured from device structures similar to Fabry-Perot lasers, although typically SOAs are designed to have a sufficiently low facet reflectivity to suppress lasing.

Figure 23:
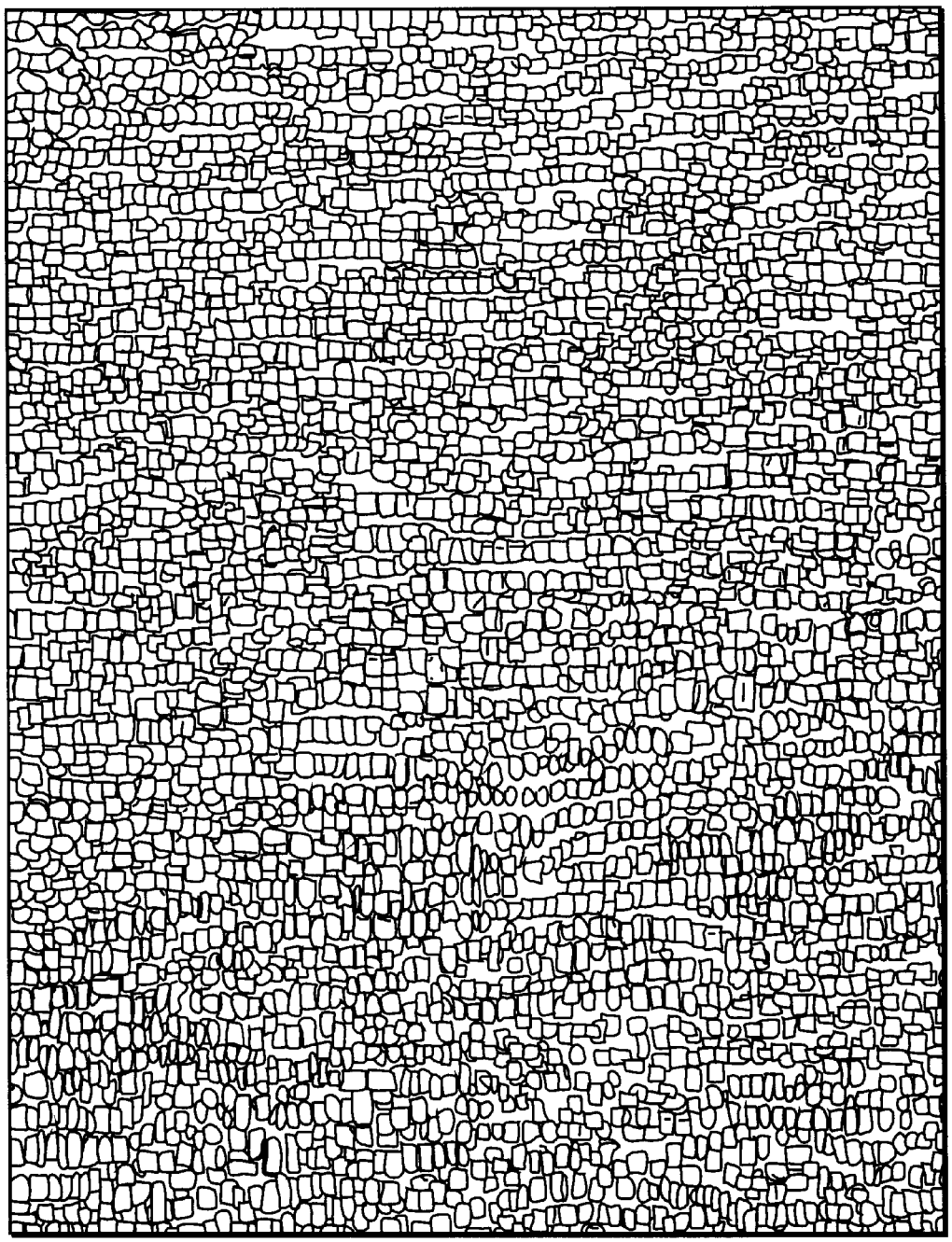
FIG. 23 is an atomic force microscopy image of chains of quantum dots.

The quantum dashes of the present invention may also be modified for use in field effect transistor (FET) structures. In transistor structures it is desirable to select growth parameters that increase the length of the dashes to form dashes having a length comparable to the channel length. FIG. 21 is a top view of a quantum dash transistor structure having a source, drain, and gate region. FIG. 22 is a cross-section view along line 22—22 of FIG. 21. The quantum dashes form the FET channel and are preferably oriented perpendicular to the gate. One benefit of the transistor structure of FIGS. 22–23 is that it may grown using similar materials as that used to fabricate quantum dash lasers, making it of potential interest for integration with quantum dash lasers. Additionally, the electron mobility in a quantum dash and saturation velocity is expected to approximately a factor of two greater than bulk material, improving the performance of the quantum dash transistor.

In another embodiment, the active region of an electrical or optical device comprises chains of quantum dots formed by growing the quantum dots using a digital alloy technique. In this embodiment, the quantum dots have a ternary or quaternary composition, with the average composition of the dot selected to have an average lattice constant at least 1.8% greater than the underlying substrate. The digital alloy technique forms the ternary/quaternary dot from a sequence of alloy layers. Each alloy layer preferably comprises atomic mono-layers or fractions of mono-layers. In one embodiment, the quantum dots are grown using MBE with the dots grown on a (100) AlGaAs surface at a growth temperature of about 510° C. In one growth sequence, beam flux rates are selected to correspond to a growth rate of GaAs of 650 nm/hr, and an InAs growth rate of 350 nm/hr. The AlGaAs surface was exposed to a sequence of fluxes: 1 s In+As$_2$; 9.5 s As$_2$, 0.5 s nothing, 1 s Ga, 0.5 s nothing, 9.5 s As$_2$, which is repeated a desired number of cycles. Experiments by the inventors indicate that under some growth conditions that a digital alloy growth technique results in the self-assembly of closely spaced dots, as shown in the AFM image of FIG. 22. The dot density is approximately $8 \times 10^9$ cm$^{-2}$. The base diameter ranges from 70 to 110 nm and the height varies from 12 to 20 nm. The AFM images indicated that that dots are linked in an apparent chain with an interdot distance of less than 10 nm at their bases with neighboring chains separated by 40 nm on average. The short inter-dot distance on each chain is close enough that quantum tunneling of electrons between dots may occur. For this case, the chain of dots is anticipated to have quantum wire-like electron transport properties and may thus be used to fabricate high performance transistor structures similar to that shown in FIG. 22.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A semiconductor active region for providing optical gain, comprising:
    a quantum well formed on a substrate; and
    a plurality of quantum dots embedded in the quantum well, the quantum dots having a size distribution and a sequence of quantum confined energy states selected to form a continuous optical gain spectrum responsive to an electrical current;
    the dots having a ground state with an associated first optical transition energy value and a first excited state having an associated second optical transition energy value, the second optical transition energy value being not greater than 30 meV greater than the first optical transition energy value.

2. The active region of claim 1, wherein an optical gain associated with the ground state is saturable.

3. The active region of claim 1, wherein the substrate is an InP substrate, the quantum well is an AlGaInAs quantum well, and the quantum dots are comprised of InAs.

4. The active region of claim 3, wherein the quantum dots are elongated quantum dots having a thickness less than a thickness of the quantum well and a length-to-width ratio in a plane parallel to the quantum well of at least about three.

5. The active region of claim 3, wherein the optical gain spectrum has a wavelength spread of at least 150 nanometers at a current density not greater than 3 kA/cm$^2$.

6. The active region of claim 3, wherein the optical gain spectrum has a wavelength spread of at least 10% relative to a center wavelength for a current density not greater than 3 kA/cm$^2$.

7. The active region of claim 6, wherein the quantum dots are elongated quantum dots having a thickness less than a thickness of the quantum well and a length-to-width ratio in a plane parallel to the quantum well of at least about three.

8. The active region of claim 1, further comprising a second excited energy level with an associated third optical transition energy value that is within 30 meV of the second optical transition energy value.

9. The active region of claim 8, wherein the separation between the third optical transition energy value and the second optical transition energy value is not greater than 20 meV.

10. A semiconductor active region for providing optical gain, comprising:
    a semiconductor quantum well having a substantially planar well layer disposed between two baffler layers and having a well thickness; and
    a plurality of quantum dots embedded in the quantum well, each quantum dot having a thickness less than the thickness of the quantum well and a length-to-width ratio in a plane parallel to the planar well layer of at least about three.

11. The semiconductor active region of claim 10, wherein the plurality of quantum dots has a distribution in size about a mean size selected to form a continuous inhomogeneously broadened optical gain spectrum.

12. The semiconductor active region of claim 11, wherein the mean size of the quantum dots is selected to include a first excited quantum state having an associated optical transition energy value that is within 30 meV of a ground state optical transition energy value.

13. The semiconductor active region of claim 11, wherein the mean size of the quantum dots is selected to include a first excited quantum state having an associated optical transition energy value that is within 20 meV of a ground state transition energy value.

14. The semiconductor active region of claim 10, wherein the quantum well is strained.

15. The semiconductor active region of claim 10, wherein the quantum dots are comprised of a semiconductor having a larger relaxed lattice constant than the semiconductor quantum well layer, further comprising:
    at least one tensile strained layer proximate the quantum dots.

16. A semiconductor laser, comprising:
    optical waveguiding means for providing optical confinement;
    quantum dot means having a sequence of quantum confined energy states with energy levels selected to provide optical gain over an extended wavelength range; and
    quantum well means for providing carrier confinement of injected current to the quantum dot means.

17. A tunable laser, comprising:
    a first optical cavity having a first end and a spaced-apart second end;
    a semiconductor active region positioned in the first optical cavity having a plurality of quantum dots embedded in a quantum well, the quantum dots having a size distribution and a sequence of quantum confined energy states selected to form a continuous optical gain spectrum;
    a first reflector reflecting light into the first end of the first optical cavity; and
    an external optical cavity including an optical element reflecting a selected wavelength of light into the second end of the first optical cavity.

18. The tunable laser of claim 17, wherein the quantum dot characteristics are selected to achieve a tuning range of greater than 150 nanometers.

19. The tunable laser of claim 17, wherein the quantum dot characteristics are selected to achieve a tuning range of greater than 10% of a minimum wavelength.

20. The tunable laser of claim 17, wherein the quantum dots have a ground state with an associated first optical transition energy value and a first excited state having an associated second optical transition energy value, the second optical transition energy value being not greater than 30 meV greater than the first optical transition energy value.

21. A tunable laser, comprising:
a first optical cavity having a first end and a spaced-apart second end;
quantum dot active region means positioned in the first optical cavity having a sequence of quantum confined energy states with energy levels selected to provide optical gain over a wavelength range of greater than 150 nanometers;
a first reflector reflecting light into the first end of the first optical cavity; and
an external optical cavity including an optical element reflecting a selected wavelength of light into the second end of the first optical cavity.

22. A tunable laser, comprising:
a laser cavity including a longitudinal waveguide having a plurality of sections;
at least one of the sections being a grating section for providing optical feedback;
at least one of the sections being a phase control section for adjusting the lasing wavelength; and
a semiconductor active region disposed in at least one of the sections having a plurality of quantum dots embedded in a quantum well, the quantum dots having a size distribution and a sequence of quantum confined energy states selected to form a continuous optical gain spectrum, the dots having a ground state with an associated first optical transition energy value and a first excited state having an associated second optical transition energy value, the second optical transition energy value being not greater than 30 meV greater than the first optical transition energy value and an optical gain associated with the ground state being saturable.

23. A monolithic multiwavelength array of lasers, comprising:
a substrate;
a semiconductor laser layer structure formed on the substrate including optical cladding layers and an active region, the active region including a semiconductor active region having a plurality of quantum dots embedded in a quantum well, the quantum dots having a size distribution and a sequence of quantum confined energy states selected to form a continuous optical gain spectrum; and
a plurality of lasers formed on the laser layer structure, each of the plurality of lasers having a Bragg grating positioned to regulate its operating wavelength, with the wavelength range of the lasers being at least 150 nanometers.

24. The array of claim 23, wherein the dots have a ground state with an associated first optical transition energy value and a first excited state having an associated second optical transition energy value, the second optical transition energy value being not greater than 30 meV greater than the first optical transition energy value, and an optical gain associated with the ground state being saturable.

25. A monolithic multiwavelength array of lasers, comprising:
a substrate;
quantum dot active region means disposed on the substrate for providing an extended optical gain spectrum;
quantum well means for confining carriers in the quantum dot active region means; and
a plurality of lasers formed on the quantum dot active region means, each of the plurality of lasers having a Bragg grating with an associated grating period and positioned to provide optical feedback to the laser.

26. A Fabry-Perot laser, comprising:
a substrate;
a semiconductor optical waveguide formed on the substrate having a first facet spaced apart from a second facet to form a Fabry-Perot optical cavity; and
an active region optically coupled to the optical waveguide, the active region including a plurality of quantum dots embedded in a quantum well, the quantum dots having a size distribution and a sequence of quantum confined energy states selected to form a continuous optical gain spectrum responsive to an electrical current, the dots having a ground state with an associated first optical transition energy value and a first excited state having an associated second optical transition energy value, the second optical transition energy value being no greater than 30 meV greater than the first optical transition energy value.

27. An optical amplifier, comprising:
a substrate;
a semiconductor optical waveguide formed on the substrate having a first facet spaced apart from a second facet to form an optical cavity; and
an active region optically coupled to the optical waveguide, the active region including a plurality of quantum dots embedded in a quantum well, the quantum dots having a size distribution and a sequence of quantum confined energy states selected to form a continuous optical gain spectrum responsive to an electrical current, the dots having a ground state with an associated first optical transition energy value and a first excited state having an associated second optical transition energy value, the second optical transition energy value being not greater than 30 meV greater than the first optical transition energy value;
the first and second facets having an associated reflectance of light back into the optical cavity which is selected to be sufficiently low to suppress Fabry-Perot lasing over a preselected range of optical gain of the active region.

28. A laser, comprising:
a substrate; a semiconductor optical waveguide formed on the substrate having a first facet spaced apart from a second facet to form an optical waveguide;
a Bragg grating having a Bragg period optically coupled to the optical waveguide to provide optical feedback at a wavelength determined by the Bragg grating; and
an active region optically coupled to the optical waveguide, the active region including a plurality of quantum dots embedded in a quantum well, the quantum dots having a size distribution and a sequence of quantum confined energy states selected to form a continuous optical gain spectrum responsive to an electrical current, the dots having a ground state with an associated first optical transition energy value and a first excited state having an associated second optical transition energy value, the second optical transition energy value being not greater than 30 meV greater than the first optical transition energy value;

the Bragg grating having a Bragg wavelength selected to be on the long side of the optical gain spectrum at a first operating temperature.

29. The laser of claim 28 wherein the semiconductor optical waveguide, the Bragg grating and the active region are arranged to form a DFB laser or a DBR laser.

30. A semiconductor active region for providing optical gain, comprising:

at least one quantum well layer supported by a substrate; and a plurality of quantum dots embedded in the quantum well layer(s), the quantum dots having a size distribution and a sequence of quantum confined energy states selected to form a continuous optical gain spectrum responsive to an electrical current.

31. The semiconductor active region of claim 30 wherein:

the at least one quantum well layer includes a first quantum well layer and a second quantum well layer; and quantum dots are embedded in both the first quantum layer and the second quantum layer.

32. The semiconductor active region of claim 30 wherein the substrate is an InP substrate, at least one of the quantum well layers is an AlGaInAs quantum well layer, and the quantum dots embedded in the AlGaInAs quantum well layer comprise InAs.

* * * * *

UNITED STATES PATENT AND TRADEMARK OFFICE
CERTIFICATE OF CORRECTION

PATENT NO. : 6,600,169 B2　　　　　　　　　　　　　　　　　　　　　　　Page 1 of 1
DATED　　　 : July 29, 2003
INVENTOR(S) : Andreas Stintz et al.

It is certified that error appears in the above-identified patent and that said Letters Patent is hereby corrected as shown below:

Title page,
Item [60], Related U.S. Application Data, please replace the entire paragraph with
-- Provisional application No. 60/234,344, filed on Sep. 22, 2000, provisional application No. 60/238,030, filed Oct. 6, 2000, provisional application No. 60/252,084, filed Nov. 21, 2000, provisonal application No. 60/276,186, filed Mar. 16, 2001, provisional application No. 60/272,307, filed Mar. 2, 2001. --

Column 20,
Line 15, please replace "baffler" with -- barrier --.

Signed and Sealed this

Eleventh Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,600,169 B2 Page 1 of 1
DATED : July 29, 2003
INVENTOR(S) : Andreas Stintz et al.

It is certified that error appears in the above-identified patent and that said Letters Patent is hereby corrected as shown below:

<u>Title page,</u>
Item [60], Related U.S. Application Data, please replace the last word in the paragraph "2001." with -- 2001, and provisional application No. 60/316,305, filed Aug. 31, 2001. --

Signed and Sealed this

Third Day of August, 2004

JON W. DUDAS
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 6,600,169 B2 | Page 1 of 1 |
| APPLICATION NO. | : 09/961560 | |
| DATED | : July 29, 2003 | |
| INVENTOR(S) | : Andreas Stintz et al. | |

It is certified that error appears in the above-identified patent and that said Letters Patent is hereby corrected as shown below:

Column 1, line 29, please amend as follows:

"may have" should read as "has"

Signed and Sealed this

Seventh Day of July, 2009

JOHN DOLL
*Acting Director of the United States Patent and Trademark Office*